(12) United States Patent
Sudo et al.

(10) Patent No.: US 11,320,792 B2
(45) Date of Patent: May 3, 2022

(54) CIRCUIT DEVICE, PHYSICAL QUANTITY MEASURING DEVICE, ELECTRONIC APPARATUS, AND VEHICLE

(71) Applicant: Seiko Epson Corporation, Tokyo (JP)

(72) Inventors: Yasuhiro Sudo, Chino (JP); Akio Tsutsumi, Chino (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/974,352

(22) Filed: Aug. 6, 2020

(65) Prior Publication Data

US 2021/0373502 A1    Dec. 2, 2021

(30) Foreign Application Priority Data

Aug. 7, 2019 (JP) .............................. JP2019-144980

(51) Int. Cl.
| | |
|---|---|
| *G04F 10/00* | (2006.01) |
| *B60R 16/02* | (2006.01) |
| *H03L 7/099* | (2006.01) |

(52) U.S. Cl.
CPC ............ *G04F 10/005* (2013.01); *B60R 16/02* (2013.01); *H03L 7/0995* (2013.01)

(58) Field of Classification Search
CPC ...... G04F 10/005; B60R 16/02; H03L 7/0995
See application file for complete search history.

(56) References Cited

U.S. PATENT DOCUMENTS

| | | | | |
|---|---|---|---|---|
| 4,744,243 A | * | 5/1988 | Tanaka ................... | F02P 7/0775 73/114.28 |
| 8,390,349 B1 | * | 3/2013 | Ravi ...................... | G04F 10/005 327/156 |
| 8,421,661 B1 | * | 4/2013 | Jee ......................... | G04F 10/005 341/143 |
| 8,564,471 B1 | * | 10/2013 | Gao ....................... | G04F 10/005 341/166 |
| 9,735,792 B2 | * | 8/2017 | Zerbe ...................... | H03L 7/083 |
| 10,958,256 B1 | * | 3/2021 | Lin ........................ | H03K 5/05 |

(Continued)

FOREIGN PATENT DOCUMENTS

| | | |
|---|---|---|
| CN | 102540865 A | 7/2012 |
| JP | 2015-128275 A | 7/2015 |

(Continued)

*Primary Examiner* — Adam D Houston
(74) *Attorney, Agent, or Firm* — Harness, Dickey & Pierce, P.L.C.

(57) ABSTRACT

Provided is a circuit device including: a clock signal generation circuit generating a plurality of multi-phase clock signals; a time-to-digital conversion circuit performing a count operation based on an i-th clock signal that corresponds to a multi-phase clock signal, to obtain a count value that corresponds to a time difference between transition timings of a first signal and a second signal, to obtain a first digital value that corresponds to a time difference between transition timings of the first signal and a j-th clock signal that corresponds to a multi-phase clock signal, and to obtain a second digital value that corresponds to a time difference between transition timings of the second signal and a k-th clock signal that corresponds to a multi-phase clock signal; and a processing circuit obtaining a digital value that corresponds to the time difference based on the count value, the first digital value, and the second digital value.

15 Claims, 15 Drawing Sheets

(56) References Cited

U.S. PATENT DOCUMENTS

| | | | |
|---|---|---|---|
| 10,962,933 B1* | 3/2021 | Waltari | H03M 1/164 |
| 10,965,305 B1* | 3/2021 | Ramaraju | H03M 1/1245 |
| 11,012,083 B1* | 5/2021 | Waltari | G04F 10/005 |
| 11,067,954 B1* | 7/2021 | Bhaumik | G04F 10/005 |
| 11,079,723 B2* | 8/2021 | Chu | G04F 10/005 |
| 2003/0098731 A1* | 5/2003 | Tabatabaei | G04F 10/00 327/160 |
| 2009/0074124 A1* | 3/2009 | Henzler | G01R 31/31709 375/371 |
| 2009/0296532 A1* | 12/2009 | Hsieh | G04F 10/005 368/120 |
| 2010/0141316 A1* | 6/2010 | Weltin-Wu | H03L 7/0991 327/159 |
| 2011/0301895 A1* | 12/2011 | Miyahara | G04F 10/005 702/72 |
| 2012/0056769 A1* | 3/2012 | Wang | G04F 10/005 341/166 |
| 2014/0340250 A1* | 11/2014 | Dosho | H03H 19/004 341/143 |
| 2015/0077279 A1* | 3/2015 | Song | G04F 10/005 341/155 |
| 2015/0145572 A1* | 5/2015 | Sato | H03L 7/085 327/159 |
| 2015/0177701 A1* | 6/2015 | Seidel | G04F 10/005 370/463 |
| 2015/0188553 A1* | 7/2015 | Familia | H03L 7/097 327/5 |
| 2017/0093412 A1* | 3/2017 | Van Brunt | H03L 7/1976 |
| 2018/0091158 A1 | 3/2018 | Sudo et al. | |
| 2018/0351558 A1* | 12/2018 | Kuo | G04F 10/005 |
| 2019/0064749 A1 | 2/2019 | Sudo | |
| 2019/0280649 A1* | 9/2019 | Jan | H03L 7/085 |
| 2020/0310359 A1* | 10/2020 | Yuan | G04F 10/005 |
| 2021/0302550 A1* | 9/2021 | Dutton | G01S 7/4865 |
| 2021/0344348 A1* | 11/2021 | Bhaumik | H03L 7/093 |

FOREIGN PATENT DOCUMENTS

| | | |
|---|---|---|
| JP | 2018-056985 A | 4/2018 |
| JP | 2019-039882 A | 3/2019 |

* cited by examiner

FIG. 13

| No | Latch [1] | [2] | [3] | [4] | [5] | [6] | [7] | [8] | [9] | TCK SELECTION |
|---|---|---|---|---|---|---|---|---|---|---|
| 0 | 0 | 1 | 0 | 1 | 0 | 1 | 0 | 1 | 1 | TCK2 |
| 1 | 0 | 1 | 0 | 1 | 0 | 1 | 0 | 1 | 0 | TCK2 |
| 2 | 1 | 1 | 0 | 1 | 0 | 1 | 0 | 1 | 0 | TCK2 |
| 3 | 1 | 0 | 0 | 1 | 0 | 1 | 0 | 1 | 0 | TCK2 |
| 4 | 1 | 0 | 1 | 1 | 0 | 1 | 0 | 1 | 0 | TCK2 |
| 5 | 1 | 0 | 1 | 0 | 1 | 1 | 0 | 1 | 0 | TCK2 |
| 6 | 1 | 0 | 1 | 0 | 1 | 0 | 0 | 1 | 0 | TCK3 |
| 7 | 1 | 0 | 1 | 0 | 1 | 0 | 0 | 1 | 0 | TCK3 |
| 8 | 1 | 0 | 1 | 0 | 1 | 0 | 1 | 0 | 0 | TCK3 |
| 9 | 1 | 0 | 1 | 0 | 1 | 0 | 1 | 0 | 0 | TCK3 |
| 10 | 1 | 0 | 1 | 0 | 1 | 0 | 1 | 0 | 1 | TCK3 |
| 11 | 0 | 1 | 0 | 1 | 1 | 0 | 1 | 0 | 1 | TCK1 |
| 12 | 0 | 1 | 0 | 1 | 0 | 0 | 1 | 0 | 1 | TCK1 |
| 13 | 0 | 1 | 0 | 1 | 0 | 0 | 1 | 0 | 1 | TCK1 |
| 14 | 0 | 1 | 0 | 1 | 0 | 1 | 1 | 0 | 1 | TCK1 |
| 15 | 0 | 1 | 0 | 1 | 0 | 1 | 1 | 0 | 1 | TCK1 |
| 16 | 0 | 1 | 0 | 1 | 0 | 1 | 1 | 0 | 1 | TCK1 |
| 17 | 0 | 1 | 0 | 1 | 0 | 1 | 0 | 0 | 1 | TCK1 |

FIG. 14

| No | Latch [1] | X[2] | [3] | X[4] | [5] | X[6] | [7] | X[8] | [9] | TCK SELECTION |
|---|---|---|---|---|---|---|---|---|---|---|
| 0 | 0 | 0 | 0 | 0 | 0 | 0 | 0 | 0 | 1 | TCK2 |
| 1 | 0 | 0 | 0 | 0 | 0 | 0 | 0 | 0 | 0 | TCK2 |
| 2 | 1 | 0 | 0 | 0 | 0 | 0 | 0 | 0 | 0 | TCK2 |
| 3 | 1 | 1 | 0 | 0 | 0 | 0 | 0 | 0 | 0 | TCK2 |
| 4 | 1 | 1 | 1 | 0 | 0 | 0 | 0 | 0 | 0 | TCK2 |
| 5 | 1 | 1 | 1 | 1 | 0 | 0 | 0 | 0 | 0 | TCK2 |
| 6 | 1 | 1 | 1 | 1 | 1 | 0 | 0 | 0 | 0 | TCK3 |
| 7 | 1 | 1 | 1 | 1 | 1 | 1 | 0 | 0 | 0 | TCK3 |
| 8 | 1 | 1 | 1 | 1 | 1 | 1 | 1 | 0 | 0 | TCK3 |
| 9 | 1 | 1 | 1 | 1 | 1 | 1 | 1 | 1 | 0 | TCK3 |
| 10 | 1 | 1 | 1 | 1 | 1 | 1 | 1 | 1 | 1 | TCK3 |
| 11 | 0 | 0 | 1 | 1 | 1 | 1 | 1 | 1 | 1 | TCK1 |
| 12 | 0 | 0 | 0 | 0 | 1 | 1 | 1 | 1 | 1 | TCK1 |
| 13 | 0 | 0 | 0 | 0 | 0 | 1 | 1 | 1 | 1 | TCK1 |
| 14 | 0 | 0 | 0 | 0 | 0 | 0 | 1 | 1 | 1 | TCK1 |
| 15 | 0 | 0 | 0 | 0 | 0 | 0 | 1 | 1 | 1 | TCK1 |
| 16 | 0 | 0 | 0 | 0 | 0 | 0 | 1 | 1 | 1 | TCK1 |
| 17 | 0 | 0 | 0 | 0 | 0 | 0 | 0 | 1 | 1 | TCK1 |

CIRCUIT DEVICE, PHYSICAL QUANTITY MEASURING DEVICE, ELECTRONIC APPARATUS, AND VEHICLE

The present application is based on, and claims priority from JP Application Serial Number 2019-144980, filed Aug. 7, 2019, the disclosure of which is hereby incorporated by reference herein its entirety.

BACKGROUND

1. Technical Field

The present disclosure relates to a circuit device, a physical quantity measuring device, an electronic apparatus, a vehicle, and the like.

2. Related Art

In the related art, a time-to-digital conversion circuit for converting time into a digital value has been known. The time-to-digital conversion circuit converts, for example, a time difference between transition timings of a first signal called a start signal and a second signal called a stop signal into a digital value. As a related art example of such a time-to-digital conversion circuit, for example, a related art technique disclosed in JP-A-2019-39882 is known. The time-to-digital conversion circuit according to JP-A-2019-39882 performs a time-to-digital conversion using a frequency difference between oscillation clock signals from two ring-type oscillation circuits as resolution.

In the time-to-digital conversion utilizing the frequency difference between the oscillation clock signals, as the time difference between the transition timings of the first signal and the second signal increases, the time for operating the two ring-type oscillation circuits increases in proportion thereto. Therefore, when the jitters of the two oscillation clock signals are each integrated, the measurement accuracy of the time-to-digital conversion may be reduced.

SUMMARY

According to some aspects of the present disclosure, it is possible to provide a circuit device, a physical quantity measuring device, an electronic apparatus, a vehicle, and the like that can suppress a decrease in measurement accuracy of time-to-digital conversion due to integration of clock jitter.

An aspect of the present disclosure relates to a circuit device including: a clock signal generation circuit that generates a plurality of multi-phase clock signals having the same frequency and different phases from each other; a time-to-digital conversion circuit performing a count operation based on an i-th clock signal that corresponds to any multi-phase clock signal of the plurality of multi-phase clock signals, to obtain a count value that corresponds to a time difference between a transition timing of a first signal and a transition timing of a second signal, to obtain a first digital value that corresponds to a time difference from the transition timing of the first signal to a transition timing of a j-th clock signal that corresponds to any multi-phase clock signal of the plurality of multi-phase clock signals, and to obtain a second digital value that corresponds to a time difference from the transition timing of the second signal to a transition timing of a k-th clock signal that corresponds to any multi-phase clock signal of the plurality of multi-phase clock signals; and a processing circuit obtaining a digital value that corresponds to the time difference between the transition timing of the first signal and the transition timing of the second signal based on the count value, the first digital value, and the second digital value.

BRIEF DESCRIPTION OF THE DRAWINGS

FIG. 13 is an explanatory diagram for a selection method of a clock signal.

FIG. 14 is an explanatory diagram for a selection method of a clock signal.

DESCRIPTION OF EXEMPLARY EMBODIMENTS

Hereinafter, the present embodiment will be described. The present embodiment to be described below does not unduly limit the contents of the present disclosure described in the appended claims. Further, all configurations to be described in the present embodiment are not limited to being essential constituent conditions.

1. Circuit Device

Figure 1:
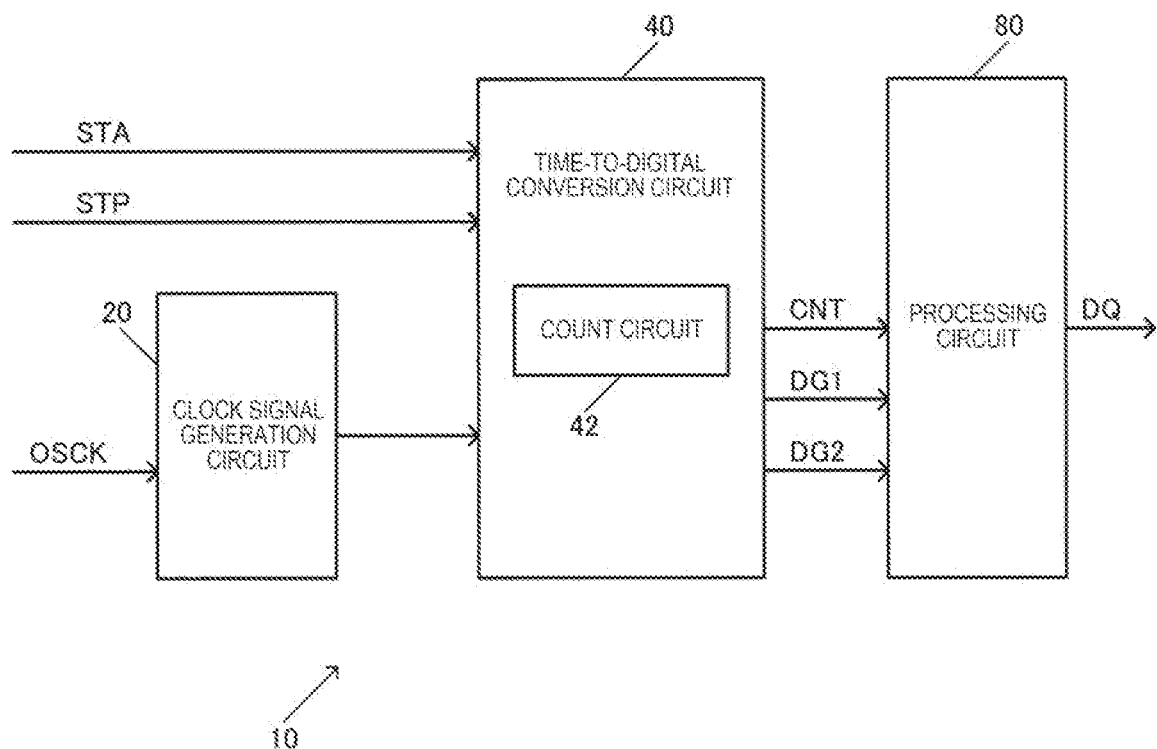
FIG. 1 shows a configuration example of a circuit device according to a present embodiment.
Figure 2:
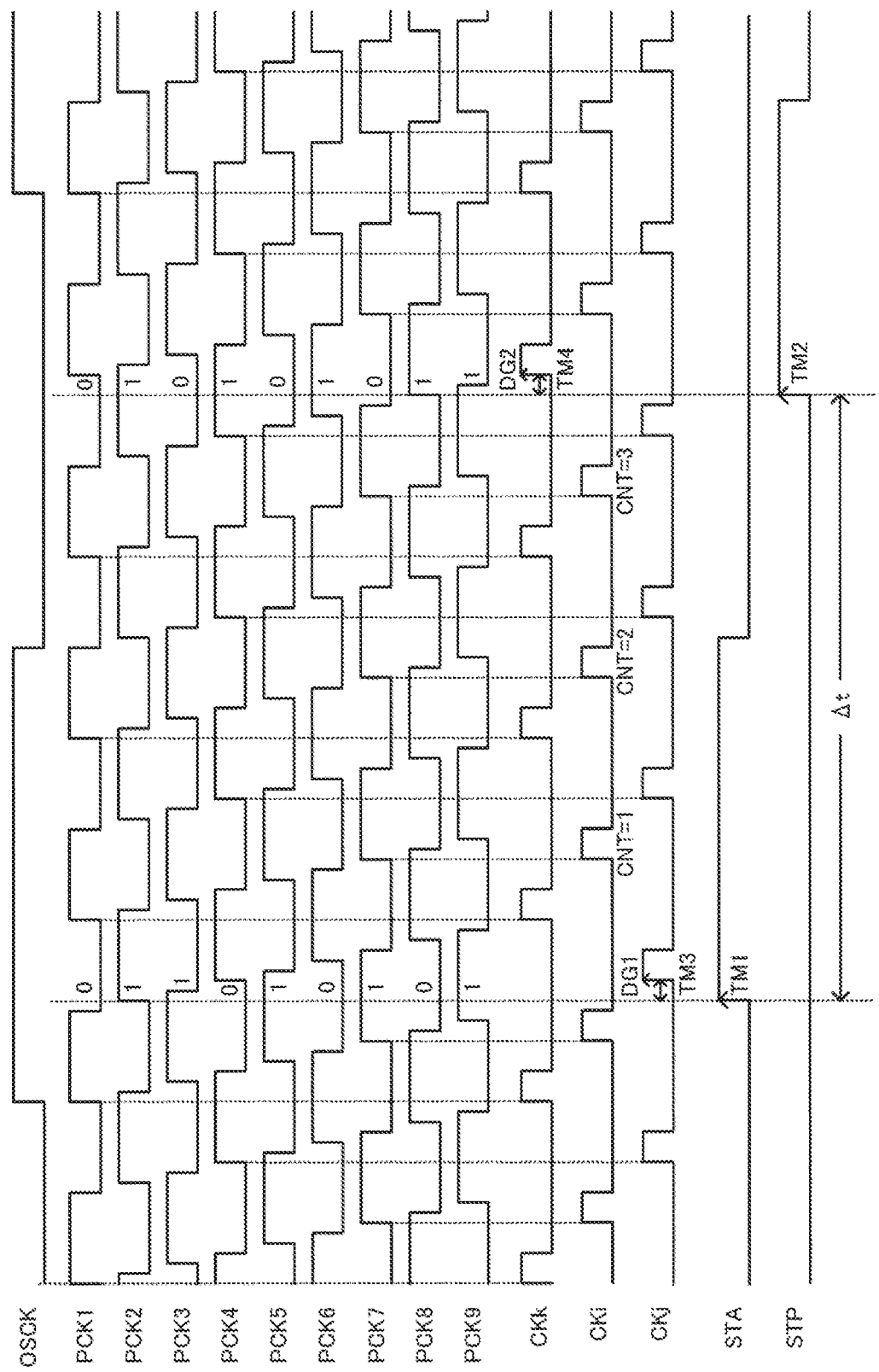
FIG. 2 is a signal waveform diagram for explaining an operation of the present embodiment.

FIG. 1 shows a configuration example of a circuit device 10 of the present embodiment, and FIG. 2 shows a signal waveform diagram for explaining an operation of the present embodiment. The circuit device 10 includes a clock signal generation circuit 20, a time-to-digital conversion circuit 40, and a processing circuit 80.

The clock signal generation circuit 20 generates a plurality of multi-phase clock signals. For example, in FIG. 2, PCK1, PCK2, PCK3, PCK4, PCK5, PC6, PCK7, PCK8, and PCK9 are generated as the plurality of multi-phase clock signals. These multi-phase clock signals PCK1 to PCK9 are, for example, clock signals having the same frequency and different phases from each other. As shown in FIG. 2, in the multi-phase clock signals PCK1 to PCK9, the phase difference between edges of adjacent multi-phase clock signals is the same. For example, a phase difference between the rising edge of PCK1 and the falling edge of PCK2 is the same as a phase difference between the falling edge of PCK2 and the rising edge of PCK3. A phase difference between the rising edge of PCK3 and the falling edge of PCK4 is the same as a phase difference between the falling edge of PCK4 and the rising edge of PCK5. The same applies to PCK6 to PCK9. In FIG. 2, the number of signals of the multi-phase clock signal is nine, but it is not limited to this, and the number of signals may be eight or less, or may be ten or more.

Figure 5:
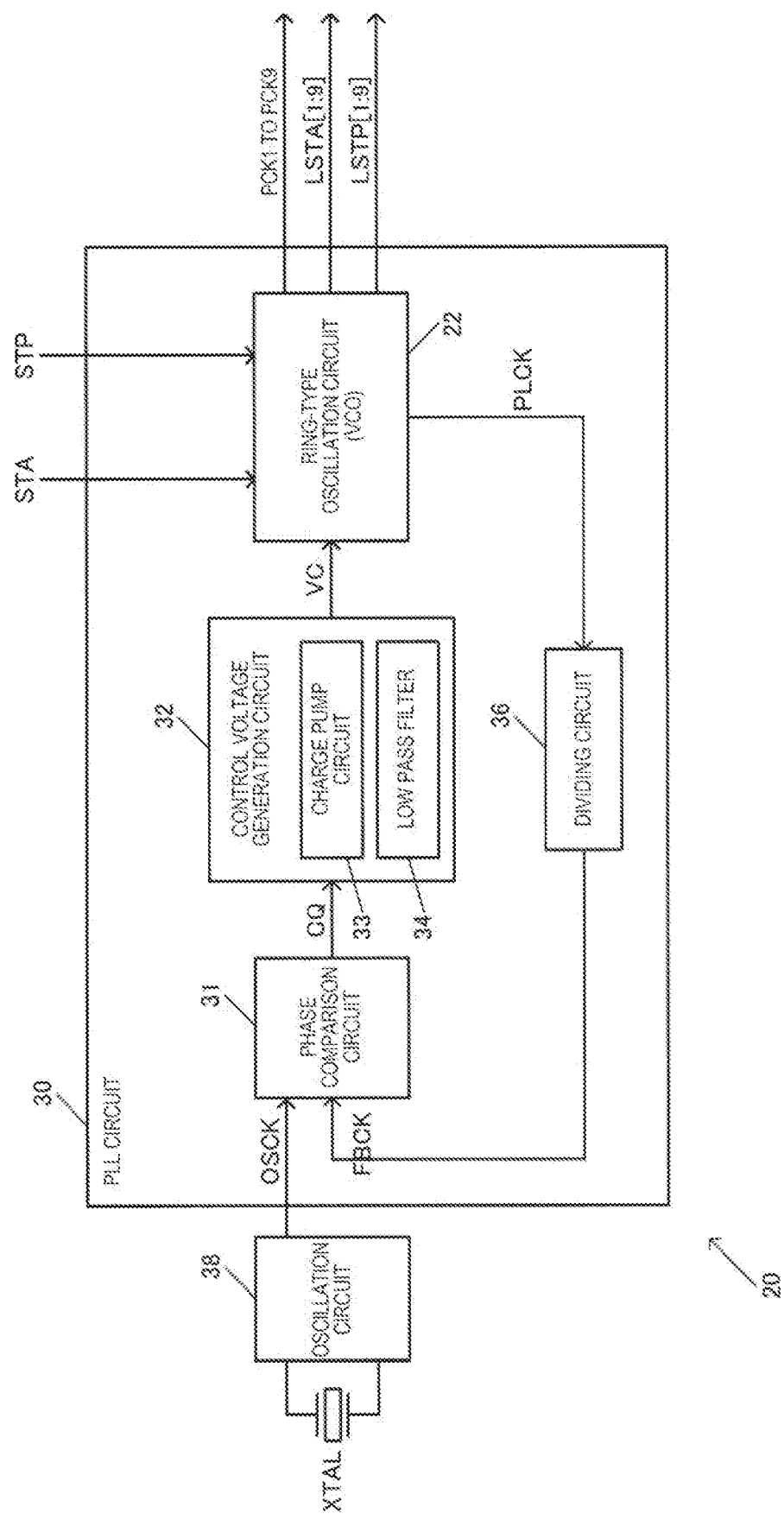
FIG. 5 shows a configuration example of the clock signal generation circuit in detail.

The clock signal generation circuit 20 generates the multi-phase clock signals PCK1 to PCK9 based on, for example, a reference clock signal OSCK. The reference clock signal OSCK is a signal generated by oscillating a resonator XTAL, for example, as shown in FIG. 5 described later. The multi-phase clock signals PCK1 to PCK9 are signals phase synchronized with the reference clock signal OSCK. For example, the multi-phase clock signals PCK1 to PCK9 are clock signals having a frequency obtained by multiplying the frequency of the reference clock signal OSCK.

The time-to-digital conversion circuit 40 performs a count operation based on a clock signal CKi corresponding to any multi-phase clock signal of the plurality of multi-phase clock signals PCK1 to PCK9, and thereby a count value CNT corresponding to a time difference $\Delta t$ between the transition timing TM1 of the signal STA and the transition timing TM2 of the signal STP is obtained. The clock signal CKi (i is an integer of 1 or more) is an i-th clock signal. The clock signal CKi is, for example, a clock signal generated based on any multi-phase clock signal of the multi-phase clock signals PCK1 to PCK9. For example, the clock signal CKi is a clock signal in which a duty ratio of any multi-phase clock signal of the multi-phase clock signals PCK1 to PCK9 is adjusted. For example, in FIG. 2, the clock signal CKi is a clock signal corresponding to the multi-phase clock signal PCK7, and is a signal that transitions at the transition timing of the multi-phase clock signal PCK7. Specifically, the clock signal CKi is a clock signal in which the duty ratio of the multi-phase clock signal PCK7 is adjusted, for example, a clock signal in which the duty ratio is adjusted to be smaller than 50%. The clock signal CKi may be any one of the multi-phase clock signals itself among the multi-phase clock signals PCK1 to PCK9.

The signal STA is a first signal, for example, a start signal. The signal STP is a second signal, for example, a stop signal. The transition timing TM1 is the timing of the rising edge of the signal STA in FIG. 2, but may be the timing of the falling edge. The transition timing TM2 is the timing of the rising edge of the signal STP in FIG. 2, but may be the timing of the falling edge. The count value CNT is a value obtained by a count operation in a period from the transition timing TM1 of the signal STA to the transition timing TM2 of the signal STP, and corresponds to a coarse time difference between the transition timings TM1 and TM2. In FIG. 2, the count value CNT=3 is obtained by the count operation based on the clock signal CKi as a coarse time difference between the transition timings TM1 and TM2.

For example, the time-to-digital conversion circuit 40 includes a count circuit 42 that performs a count operation from the transition timing TM1 of the signal STA to the transition timing TM2 of the signal STP based on the clock signal CKi and outputs the count value CNT. For example, the count circuit 42 starts the count operation with the count operation enabled at the transition timing TM1 of the signal STA. As shown in FIG. 2, the count circuit 42 updates the count value CNT at a transition timing which is a rising edge of the clock signal CKi. For example, the count value is incremented such as CNT=1, CNT=2, and CNT3. The count circuit 42 stops the count operation with the count operation disabled at the transition timing TM2 of the signal STP. In this manner, the count value CNT corresponding to the time difference $\Delta t$ from the transition timing TM1 of the signal STA to the transition timing TM2 of the signal STP can be obtained, and coarse time measurement of the time difference $\Delta t$ can be performed.

Further, the time-to-digital conversion circuit obtains a digital value DG1 corresponding to a time difference from the transition timing TM1 of the signal STA to the transition timing TM3 of the clock signal CKj which corresponds to any multi-phase clock signal of the plurality of multi-phase clock signals PCK1 to PCK9. That is, a digital value DG1 corresponding to a fine time difference between the transition timings of the signal STA and the clock signal CKj is obtained. The digital value DG1 is a first digital value. The clock signal CKj is a j-th clock signal (j is an integer of 1 or more). For example, in FIG. 2, the clock signal CKj is a clock signal corresponding to the multi-phase clock signal PCK7, and is a signal that transitions at the transition timing of the multi-phase clock signal PCK4. For example, the clock signal CKj is a clock signal obtained by adjusting the duty ratio of the multi-phase clock signal PCK4. The clock signal CKj may be any one of the multi-phase clock signals itself among the multi-phase clock signals PCK1 to PCK9.

Further, the time-to-digital conversion circuit obtains a digital value DG2 corresponding to a time difference from the transition timing TM2 of the signal STP to the transition timing TM4 of the clock signal CKk which corresponds to any multi-phase clock signal of the plurality of multi-phase clock signals PCK1 to PCK9. That is, a digital value DG2 corresponding to a fine time difference between the transition timings of the signal STP and the clock signal CKk is obtained. The digital value DG2 is a second digital value. The clock signal CKk is a k-th clock signal (k is an integer of 1 or more). For example, in FIG. 2, the clock signal CKk is a clock signal corresponding to the multi-phase clock signal PCK1, and is a signal that transitions at the transition timing of the multi-phase clock signal PCK1. For example, the clock signal CKk is a clock signal obtained by adjusting the duty ratio of the multi-phase clock signal PCK1. The clock signal CKk may be any one of the multi-phase clock signals itself among the multi-phase clock signals PCK1 to PCK9.

Further, the processing circuit 80 obtains a digital value DQ corresponding to a time difference $\Delta t$ between the transition timing TM1 of the signal STA and the transition timing TM2 of the signal STP based on the count value CNT, and the digital values DG1 and DG2. That is, the coarse time measurement of the time difference $\Delta t$ is performed using the count value CNT, and the fine time measurement of the time difference $\Delta t$ is performed based on the digital values DG1 and DG2. For example, the approximate length of the time difference $\Delta t$ is measured by a count value CNT obtained by performing the count operation based on the clock signal CKi in a period from the transition timing TM1 of the signal STA to the transition timing TM2 of the signal STP. The fine time measurement of the time difference $\Delta t$ is performed by obtaining the digital value DG1 corresponding to a time difference between the transition timing TM1 of the signal STA and the transition timing TM3 of the clock signal CKj, and obtaining the digital value DG2 corresponding to a time difference between the transition timing TM2 of the signal STP and the transition timing TM4 of the clock signal CKk. For example, as described later, the time difference Δt is obtained by predetermined arithmetic operation processing using the count value CNT and the digital values DG1 and DG2. For example, the time difference Δt is obtained by a predetermined arithmetic operation expression using the count value CNT and the digital values DG1 and DG2, which are unknown values, and the known value.

Figure 3:
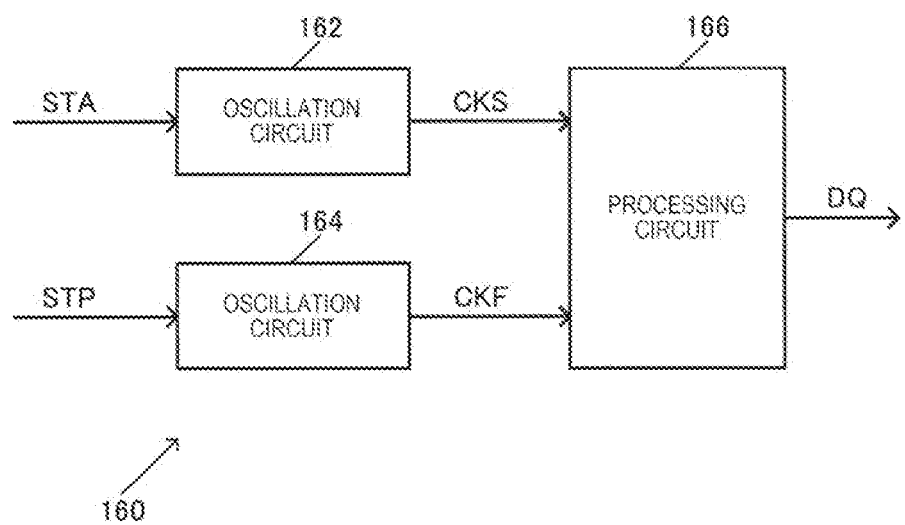
FIG. 3 is an explanatory diagram of a time-to-digital conversion method of a comparative example.

FIG. 3 is an explanatory diagram of a time-to-digital conversion method of a comparative example. In the time-to-digital conversion circuit 160 of the comparative example, the oscillation clock signal CKS is generated by starting the oscillation operation of the oscillation circuit 162 at the transition timing of the signal STA. Further, the oscillation clock signal CKF having a higher frequency than the oscillation clock signal CKS is generated by starting the oscillation operation of the oscillation circuit 164 at the transition timing of the signal STP. The processing circuit 166 compares the phase of the oscillation clock signal CKS with the phase of the oscillation clock signal CKF, thereby obtaining the digital value DQ corresponding to the time difference Δt between the transition timings of the signal STA and the signal STP. Specifically, the processing circuit 166 outputs a count value obtained by the count operation in the period until the edge of the oscillation clock signal CKF passes the edge of the oscillation clock signal CKS as a digital value DQ corresponding to the time difference Δt. Thereby, the time-to-digital conversion with a resolution corresponding to the frequency difference between the oscillation clock signal CKF and the oscillation clock signal CKS can be realized.

However, in the method of the comparative example, when the time to be measured becomes longer and the time difference Δt becomes longer, the time for operating the oscillation circuits 162 and 164 becomes longer in proportion thereto. Therefore, the clock jitters in the oscillation circuits 162 and 164 are each integrated, and the timing when the edge of the oscillation clock signal CKF passes the edge of the oscillation clock signal CKS becomes unstable. Accordingly, there is a problem that the measurement accuracy of the time-to-digital conversion is reduced.

Figure 6:
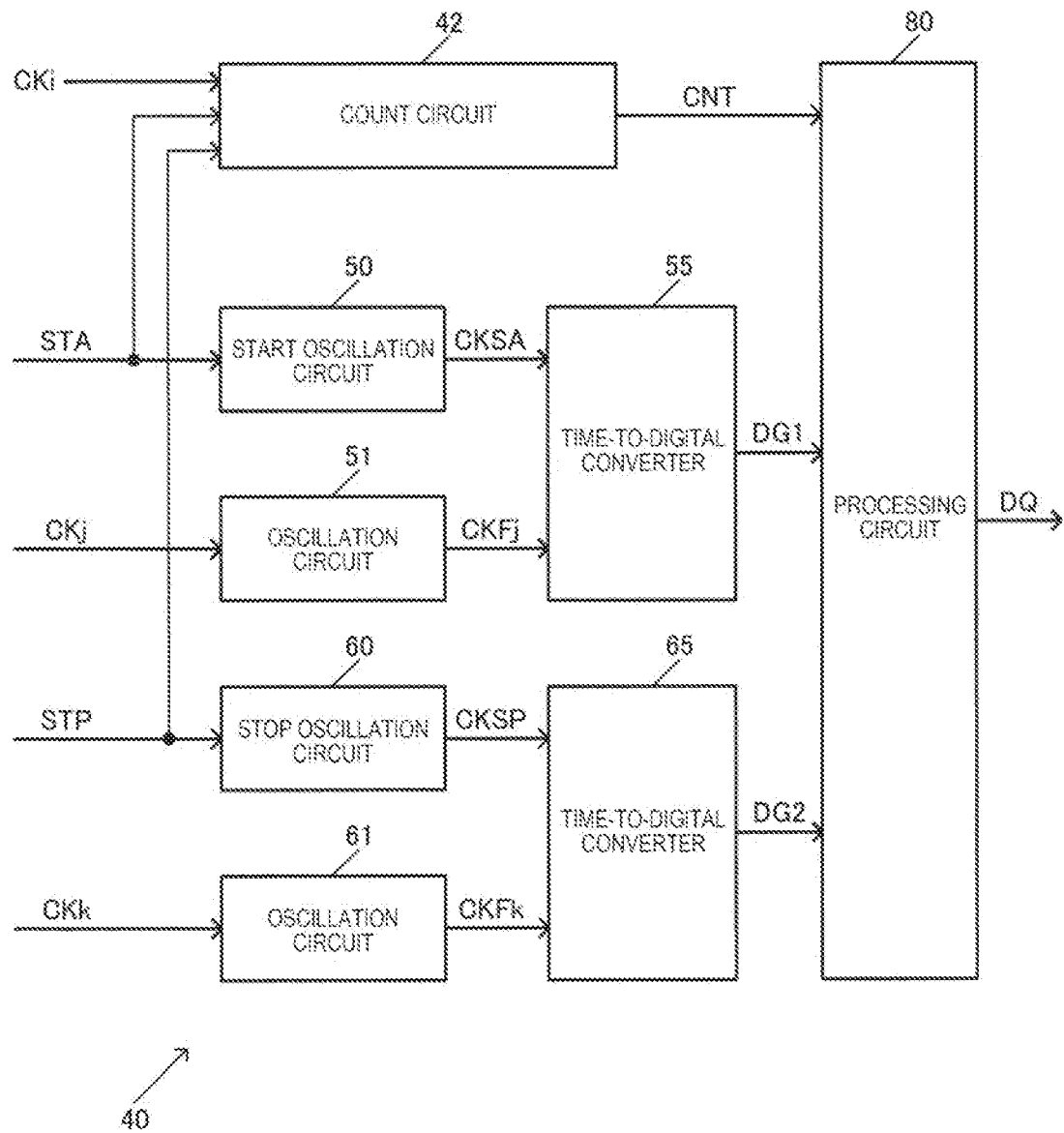
FIG. 6 shows a configuration example of a time-to-digital conversion circuit.

In this regard, according to the present embodiment, even when the time difference Δt becomes longer, the coarse time measurement for the time difference Δt is performed by obtaining the count value CNT through the count operation based on the clock signal CKi. The fine time measurement for the time difference Δt is performed by obtaining the digital value DG1 corresponding to a time difference between the transition timing TM1 of the signal STA and the transition timing TM3 of the clock signal CKj, and obtaining the digital value DG2 corresponding to a time difference between the transition timing TM2 of the signal STP and the transition timing TM4 of the clock signal CKk. For example, with a resolution corresponding to the frequency difference between the oscillation clock signals as shown in FIG. 6 or the like, the time difference Δt can be measured with high accuracy by obtaining the digital value DG1 corresponding to the time difference between the transition timings TM1 and TM3 and the digital value DG2 corresponding to the time difference between the transition timings TM2 and TM4. Therefore, even when the time difference Δt becomes longer, it is possible to cope with this, and it is possible to provide the circuit device 10 which can suppress a decrease in the measurement accuracy of the time-to-digital conversion due to the integration of the clock jitters.

FIG. 2 shows an example in which clock signals CKi, CKj, and CKk are clock signals corresponding to multi-phase clock signals PCK7, PCK4, and PCK1, respectively. However, the present embodiment is not limited to this. For example, at least two of the clock signals CKi, CKj, and CKk may be the same clock signal. For example, which one of the multi-phase clock signals PCK1 to PCK9 is assigned to the clock signals CKi, CKj, or CKk may be variably set or may be fixed. For example, as described later, which one of the multi-phase clock signals PCK1 to PCK9 is assigned to the clock signal CKi, the clock signal CKj, or the clock signal CKk may be determined based on the signal levels of the multi-phase clock signals PCK1 to PCK9 at the transition timing TM1 of the signal STA and the signal levels of the multi-phase clock signals PCK1 to PCK9 at the transition timing TM2 of the signal STP. For example, in FIG. 2, the signal levels (voltage levels) of the multi-phase clock signals PCK1 to PCK9 at the transition timing TM1 of the signal STA are signal levels corresponding to "011010101", and based on the information of "011010101", it is determined which one of the multi-phase clock signals PCK1 to PCK9 is assigned to the clock signal CKi, the clock signal CKj, or the clock signal CKk. Further, the signal levels of the multi-phase clock signals PCK1 to PCK9 at the transition timing TM2 of the signal STP are signal levels corresponding to "010101011", and based on the information of "010101011", it is determined which one of the multi-phase clock signals PCK1 to PCK9 is assigned to the clock signal CKi, the clock signal CKj, or the clock signal CKk.

Figure 4:
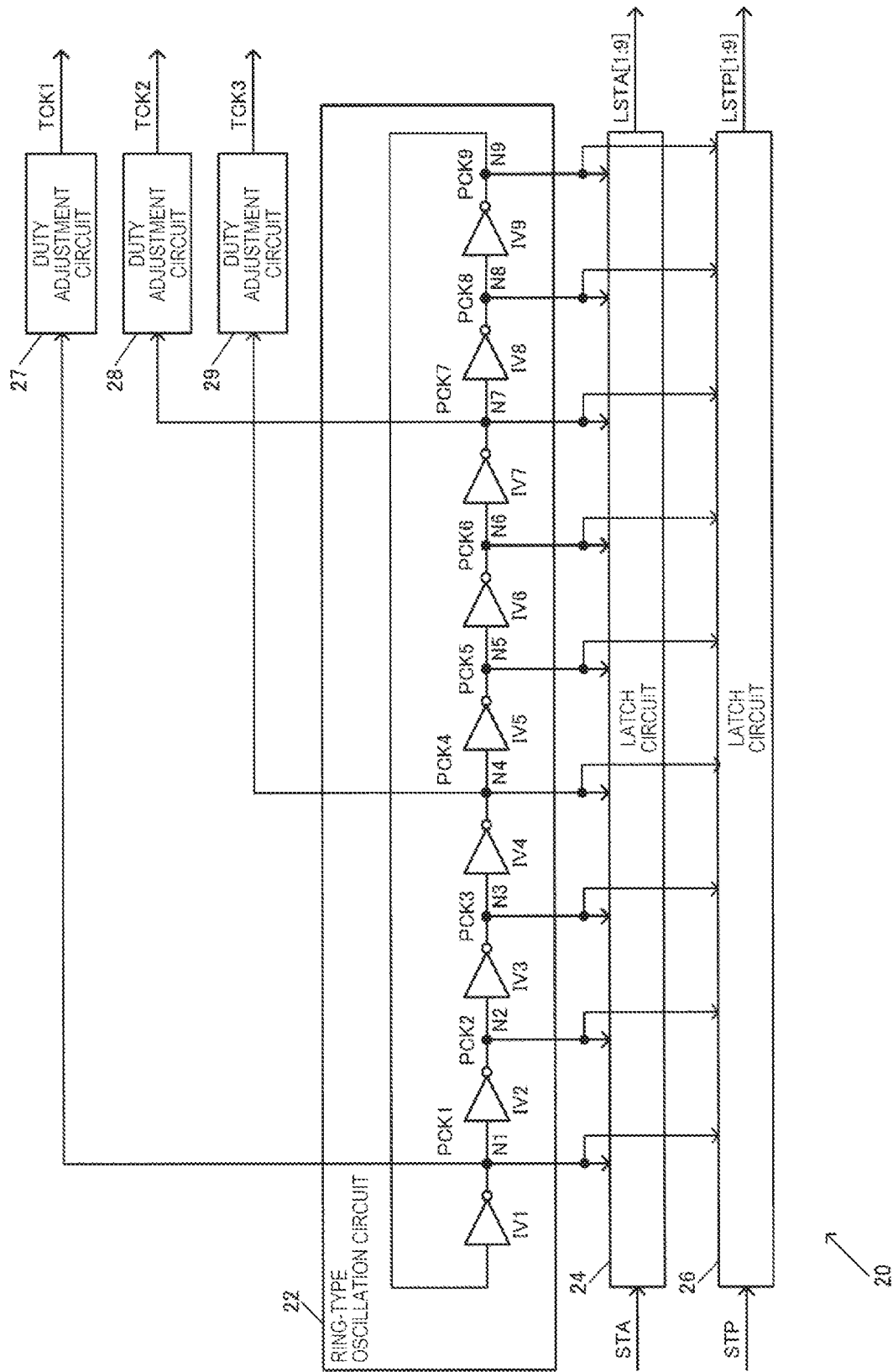
FIG. 4 shows a configuration example of a clock signal generation circuit.

FIG. 4 shows a configuration example of a clock signal generation circuit 20. As shown in FIG. 4, the clock signal generation circuit 20 includes a ring-type oscillation circuit 22 that outputs the plurality of multi-phase clock signals PCK1 to PCK9 from a plurality of intermediate nodes N1 to N9. Further, the clock signal generation circuit 20 can include latch circuits 24 and 26 or duty adjustment circuits 27, 28, and 29.

The ring-type oscillation circuit 22 has a plurality of inverters IV1 to IV9 connected in a ring-shape. That is, the inverters IV1 to IV9, which are delay elements, are connected in cascade, and the output of the inverter IV9, which is the last delay element, is input to the inverter IV1, which is the first delay element. A node between the inverters IV1 and IV2 is an intermediate node N1, and a multi-phase clock signal PCK1 is output from the intermediate node N1. Further, a node between the inverters IV2 and IV3 is an intermediate node N2, and a multi-phase clock signal PCK2 is output from the intermediate node N2. Similarly, the multi-phase clock signals PCK3 to PCK9 are output from the intermediate nodes N3 to N9 between adjacent inverters IV3 to IV9.

The latch circuit 24 is a circuit that latches the multi-phase clock signals PCK1 to PCK9 at the transition timing TM1 of the signal STA. Thereby, information about the signal levels of the multi-phase clock signals PCK1 to PCK9 at the transition timing TM1 is output from the latch circuit 24 as the latch signal LSTA [1:9]. Taking FIG. 2 as an example, the latch signal LSTA [1:9]=[011010101] is output.

The latch circuit 26 is a circuit that latches the multi-phase clock signals PCK1 to PCK9 at the transition timing TM2 of the signal STP. Thereby, information about the signal levels of the multi-phase clock signals PCK1 to PCK9 at the transition timing TM2 is output from the latch circuit 26 as the latch signal LSTP [1:9]. Taking FIG. 2 as an example, the latch signal LSTP [1:9]=[010101011] is output.

The duty adjustment circuit 27 receives the multi-phase clock signal PCK1 and outputs a clock signal TCK1 in which duty is adjusted such that the H-level period of the multi-phase clock signal PCK1 is shortened. The clock signal TCK1 is a first clock signal. The duty adjustment circuit 28 receives the multi-phase clock signal PCK7 and outputs a clock signal TCK2 in which duty is adjusted such that the period of the H-level of the multi-phase clock signal PCK7 is shortened. The clock signal TCK2 is a second clock signal. The duty adjustment circuit 29 receives the multi-phase clock signal PCK4 and outputs a clock signal TCK3 in which duty is adjusted such that the H-level period of the multi-phase clock signal PCK4 is shortened. The clock signal TCK3 is a third clock signal.

By providing the ring-type oscillation circuit 22 in the clock signal generation circuit 20 as shown in FIG. 4, the plurality of multi-phase clock signals PCK1 to PCK9 having the same frequency and different phases from each other are output from the intermediate nodes N1 to N9 of the ring-type oscillation circuit 22. Using the clock signals CKi, CKj, and CKk corresponding to any multi-phase clock signals of these multi-phase clock signals PCK1 to PCK9, the count value CNT and the digital values DG1 and DG2 are obtained, and the time difference Δt between the transition timings of the signal STA and the signal STP can be measured with high accuracy.

FIG. 5 shows a configuration example of the clock signal generation circuit 20 in detail. The clock signal generation circuit 20 in FIG. 5 includes a PLL circuit 30 in which a ring-type oscillation circuit 22 is provided as a voltage controlled oscillation circuit (VCO) and a plurality of multi-phase clock signals PCK1 to PCK9 that are phase synchronized with the reference clock signal OSCK generated using a resonator XTAL are generated. That is, the PLL circuit 30 generates the multi-phase clock signals PCK1 to PCK9 which are in phase synchronization with the reference clock signal OSCK and have a frequency obtained by multiplying the frequency of the reference clock signal OSCK.

The oscillation circuit 38 generates a reference clock signal OSCK by oscillating the resonator XTAL. The oscillation circuit 38 includes an oscillation drive circuit provided between a first resonator terminal and a second resonator terminal to which the resonator XTAL is coupled. For example, the oscillation circuit 38 can be realized by a transistor such as a bipolar transistor that realizes a drive circuit, and an active element such as a capacitor or a resistor. As the oscillation circuit 38, various types of oscillation circuits can be used such as a Pierce type, a Colpitts type, an inverter type, or a Hartley type.

The resonator XTAL is an element generating mechanical vibration by an electric signal. The resonator XTAL can be realized by a resonator element such as a quartz crystal resonator element. For example, the resonator XTAL can be realized by a quartz crystal resonator element in which a cut angle vibrates in a thickness-slide manner such as an AT cut or an SC cut. The resonator XTAL according to the present embodiment can be realized by various resonator elements such as resonator elements other than a thickness-slide vibration type or piezoelectric resonator elements formed of materials other than quartz crystal. For example, as the resonator XTAL, a surface acoustic wave (SAW) resonator, a micro electro mechanical systems (MEMS) resonator as a silicon resonator formed using a silicon substrate, or the like may be adopted.

The PLL circuit 30 receives the reference clock signal OSCK from the oscillation circuit 38 as an input clock signal and performs a phase locked loop (PLL) operation. For example, the PLL circuit 30 generates an output clock signal PLCK having a frequency obtained by multiplying the frequency of the reference clock signal OSCK. That is, a highly accurate output clock signal PLCK that is phase synchronized with the reference clock signal OSCK is generated. The PLL circuit 30 includes a phase comparison circuit 31, a control voltage generation circuit 32, a ring-type oscillation circuit 22 that is a voltage controlled oscillation circuit (VCO), and a dividing circuit 36.

The phase comparison circuit 31 performs a phase comparison between the reference clock signal OSCK and a feedback clock signal FBCK. For example, the phase comparison circuit 31 compares the phases of the reference clock signal OSCK and the feedback clock signal FBCK, and outputs a signal CQ corresponding to a phase difference between the reference clock signal OSCK and the feedback clock signal FBCK as a signal of a phase comparison result. The signal CQ corresponding to the phase difference is, for example, a pulse signal of a pulse width proportional to the phase difference.

The control voltage generation circuit 32 generates a control voltage VC based on the result of the phase comparison obtained from the phase comparison circuit 31. For example, the control voltage generation circuit 32 performs a charge pump operation by the charge pump circuit 33 based on the signal CQ of the phase comparison result from the phase comparison circuit 31 and performs filtering processing with a low-pass filter to generate a control voltage VC for controlling the oscillation of the ring-type oscillation circuit 22.

The ring-type oscillation circuit 22 generates an output clock signal PLCK having a frequency corresponding to the control voltage VC. For example, the multi-phase clock signal PCK9 in FIG. 4 is output as an output clock signal PLCK. Various methods can be considered as a control method of the frequency of the output clock signal PLCK based on the control voltage VC. For example, in FIG. 4, a variable capacitance element such as a varactor is provided at the output node of each of the inverters IV1 to IV9, and the capacity of the variable capacitance element is changed based on the control voltage VC, thereby the frequency of the output clock signal PLCK may be controlled. Alternatively, a current source for supplying a drive current to each of the inverters IV1 to IV9 is provided and this drive current is controlled based on the control voltage VC, thereby the frequency of the output clock signal PLCK may be controlled.

The dividing circuit 36 divides the output clock signal PLCK and outputs a feedback clock signal FBCK. For example, the dividing circuit 36 outputs a signal having a frequency obtained by dividing the frequency of the output clock signal PLCK by the division ratio set by division ratio setting data as a feedback clock signal FBCK to the phase comparison circuit 31. Thereby, the frequency of the multi-phase clock signals PCK1 to PCK9, which is the frequency of the output clock signal PLCK, can be set to a frequency obtained by multiplying the frequency of the reference clock signal OSCK. The oscillation frequency of the resonator XTAL is, for example, substantially 10 MHz to 150 MHz, and the division ratio of the dividing circuit 36 is, for example, substantially 2 to 64 division.

As described above, by providing the PLL circuit 30 as shown in FIG. 5 for the clock signal generation circuit 20, the multi-phase clock signals PCK1 to PCK9 synchronized with the reference clock signal OSCK can be generated, and the frequencies of the multi-phase clock signals PCK1 to PCK9 can be set to a frequency obtained by multiplying the frequency of the reference clock signal OSCK. Since the reference clock signal OSCK is a clock signal generated by, for example, oscillating the resonator XTAL, the frequency of the reference clock signal OSCK can be made highly accurate, and the frequencies of the multi-phase clock signals PCK1 to PCK9 can also be made highly accurate. As described above, the frequency of the multi-phase clock signals PCK1 to PCK9 becomes higher in accuracy, so that the time-to-digital conversion can be made more accurate.

FIG. 6 shows a configuration example of the time-to-digital conversion circuit 40. The time-to-digital conversion circuit 40 includes a start oscillation circuit 50, an oscillation circuit 51, a stop oscillation circuit 60, an oscillation circuit 61, and time-to-digital converters 55 and 65. Further, a count circuit 42 can be included.

The start oscillation circuit 50 starts oscillation at the transition timing of the signal STA, which is the first signal, and generates an oscillation clock signal CKSA. The start oscillation circuit 50 is an oscillation circuit for the first signal, and the oscillation clock signal CKSA is an oscillation clock signal for the first signal. The oscillation circuit 51 starts oscillation at the transition timing of the clock signal CKj, which is a j-th clock signal, and generates an oscillation clock signal CKFj having a frequency different from that of the oscillation clock signal CKSA. The oscillation clock signal CKFj is the j-th oscillation clock signal, and is a clock signal having a higher frequency than that of the oscillation clock signal CKSA. The start oscillation circuit 50 and the oscillation circuit 51 can be realized by, for example, a ring-type oscillation circuit or the like.

The time-to-digital converter 55 outputs a digital value DG1 based on the oscillation clock signal CKSA and the oscillation clock signal CKFj. The time-to-digital converter 55 is a first time-to-digital converter, and the digital value DG1 is a first digital value. For example, the time-to-digital converter 55 compares the phase of the oscillation clock signal CKSA with the phase of the oscillation clock signal CKFj, and obtains and outputs a digital value DG1 corresponding to the time difference between the transition timings of the signal STA and the clock signal CKj. That is, the digital value DG1 corresponding to the time difference between the transition timings TM1 and TM3 shown in FIG. 2 is obtained. Specifically, the time-to-digital converter 55 outputs, as a digital value DG1, a count value obtained by a count operation in a period until the edge of the oscillation clock signal CKFj passes the edge of the oscillation clock signal CKSA.

The stop oscillation circuit 60 starts oscillation at the transition timing of the signal STP, which is the second signal, and generates an oscillation clock signal CKSP. The stop oscillation circuit 60 is an oscillation circuit for the second signal, and the oscillation clock signal CKSP is an oscillation clock signal for the second signal. The oscillation circuit 61 starts oscillation at the transition timing of the clock signal CKk, which is a k-th clock signal, and generates an oscillation clock signal CKFk having a different frequency from that of the oscillation clock signal CKSP. The oscillation clock signal CKFk is the k-th oscillation clock signal, and is a clock signal having a higher frequency than that of the oscillation clock signal CKSP. The stop oscillation circuit 60 and the oscillation circuit 61 can be realized by, for example, a ring-type oscillation circuit.

The time-to-digital converter 65 outputs a digital value DG2 based on the oscillation clock signal CKSP and the oscillation clock signal CKFk. The time-to-digital converter 65 is a second time-to-digital converter, and the digital value DG2 is a second digital value. For example, the time-to-digital converter 65 compares the phase of the oscillation clock signal CKSP with the phase of the oscillation clock signal CKFk, and obtains and outputs a digital value DG2 corresponding to the time difference between the transition timings of the signal STP and the clock signal CKk. That is, the digital value DG2 corresponding to the time difference between the transition timings TM2 and TM4 shown in FIG. 2 is obtained. Specifically, the time-to-digital converter 65 outputs, as a digital value DG2, a count value obtained by a count operation in a period until the edge of the oscillation clock signal CKFk passes the edge of the oscillation clock signal CKSP.

Further, based on the count value CNT from the count circuit 42 and the digital values DG1 and DG2 from the time-to-digital converters 55 and 65, the processing circuit 80 obtains and outputs the digital value DQ corresponding to the time difference Δt between the transition timings TM1 and TM2 of the signal STA and the signal STP in FIG. 2.

According to the time-to-digital conversion circuit 40 having the configuration shown in FIG. 6, the time difference between the transition timings TM1 and TM3 of the signal STA and the clock signal CKj can be measured with a resolution corresponding to the frequency difference between the oscillation clock signal CKSA of the start oscillation circuit 50 and the oscillation clock signal CKFj of the oscillation circuit 51, and can be output as a digital value DG1. Further, the time difference between the transition timings TM2 and TM4 of the signal STP and the clock signal CKk can be measured at a resolution corresponding to the frequency difference between the oscillation clock signal CKSP of the stop oscillation circuit 60 and the oscillation clock signal CKFk of the oscillation circuit 61, and can be output as a digital value DG2. Therefore, it is possible to realize high accuracy of the time measurement of the time-to-digital conversion circuit 40.

2. Detailed Configuration Example

Figure 7:
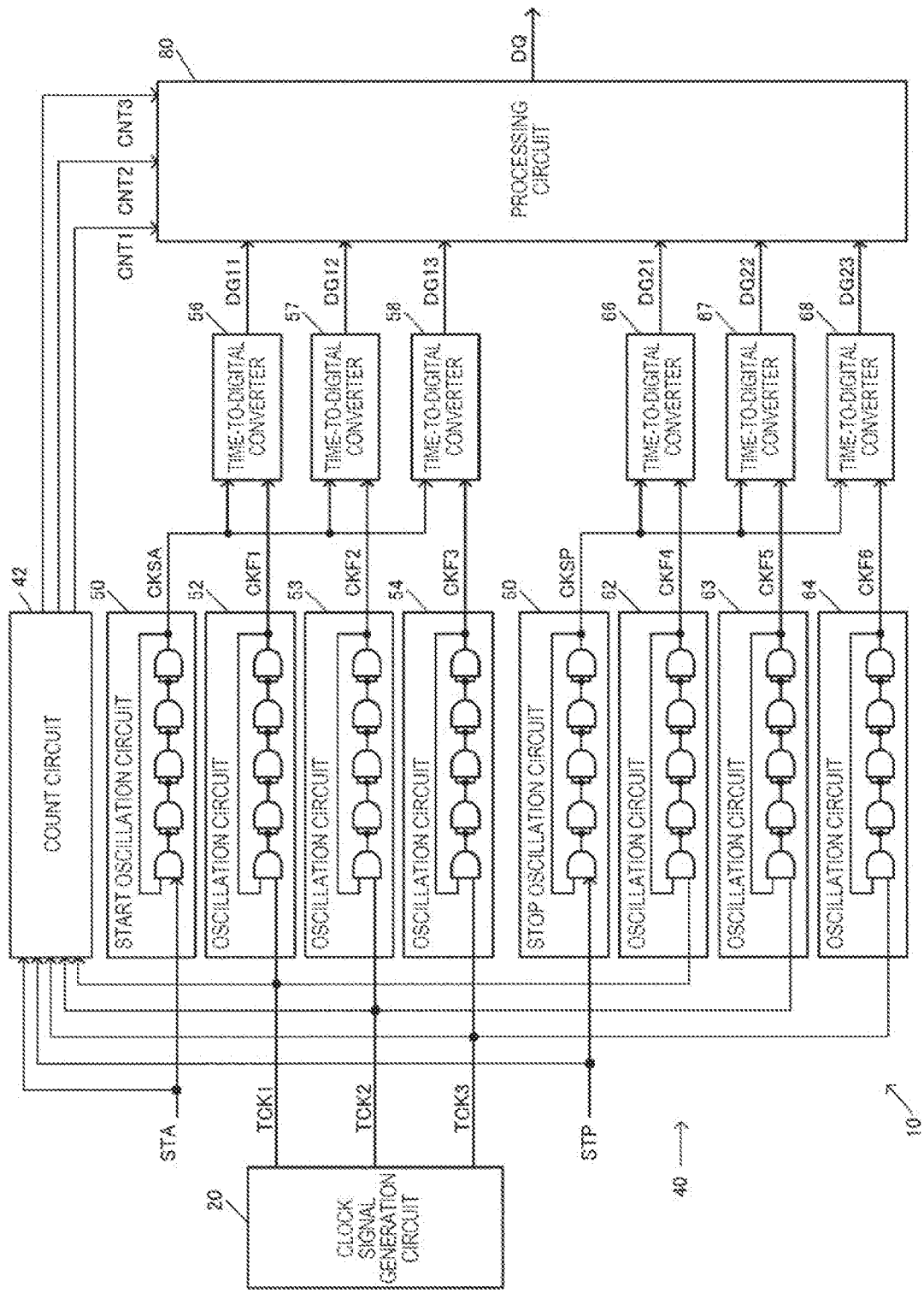
FIG. 7 shows a configuration example of the time-to-digital conversion circuit in detail.

FIG. 7 shows a configuration example of the circuit device 10 of the present embodiment in detail. The circuit device 10 in FIG. 7 includes a clock signal generation circuit 20, a time-to-digital conversion circuit 40, and a processing circuit 80. The circuit device 10 is not limited to the configuration shown in FIG. 7, and various modifications such as omitting some of these components or adding other components are possible.

As described with reference to FIG. 4, the clock signal generation circuit 20 outputs the clock signal TCK1 corresponding to the multi-phase clock signal PCK1 among the PCK1 to PCK9, the clock signal TCK2 corresponding to the multi-phase clock signal PCK7, and the clock signal TCK3 corresponding to the multi-phase clock signal PCK4. The multi-phase clock signal PCK1 is a first multi-phase clock signal, and the clock signal TCK1 is a first clock signal. The multi-phase clock signal PCK7 is a second multi-phase clock signal, and the clock signal TCK2 is a second clock signal. The multi-phase clock signal PCK4 is a third multi-phase clock signal, and the clock signal TCK3 is a third clock signal. Each of the clock signals CKi, CKj, and CKk described with reference to FIGS. 1, 2, and 6 becomes one of the clock signals TCK1, TCK2, and TCK3. Thereby, the time-to-digital conversion circuit 40 can output the count value CNT or the digital values DG1, DG2 using the clock signals TCK1, TCK2, TCK3 output from the clock signal generation circuit 20.

As shown in FIG. 7, the time-to-digital conversion circuit 40 includes a start oscillation circuit 50, oscillation circuits 52, 53, and 54, and time-to-digital converters 56, 57, and 58. The start oscillation circuit 50 is an oscillation circuit for the first signal, and the oscillation circuits 52, 53, and 54 are a first oscillation circuit, a second oscillation circuit, and a third oscillation circuit, respectively. These are ring-type oscillation circuits. The time-to-digital converters 56, 57, and 58 are a first time-to-digital converter, a second time-to-digital converter, and a third time-to-digital converter, respectively.

The start oscillation circuit 50 starts oscillation at the transition timing of the signal STA and generates an oscillation clock signal CKSA which is the oscillation clock signal for the first signal.

The oscillation circuit 52 starts oscillation at the transition timing of the clock signal TCK1, which is the first clock signal, and generates an oscillation clock signal CKF1 having a frequency different from that of the oscillation clock signal CKSA. The oscillation clock signal CKF1 is a first oscillation clock signal, and has a higher frequency than that of the oscillation clock signal CKSA. For example, when the frequency of the oscillation clock signal CKSA is 500 MHz, the frequency of the oscillation clock signal CKF1 is slightly higher, for example, 501 MHz.

The oscillation circuit 53 starts oscillation at the transition timing of the clock signal TCK2, which is the second clock signal, and generates an oscillation clock signal CKF2 having a frequency different from that of the oscillation clock signal CKSA. The oscillation clock signal CKF2 is a second oscillation clock signal, and has a higher frequency than that of the oscillation clock signal CKSA.

The oscillation circuit 54 starts oscillation at the transition timing of the clock signal TCK3, which is the third clock signal, and generates an oscillation clock signal CKF3 having a frequency different from that of the oscillation clock signal CKSA. The oscillation clock signal CKF3 is a third oscillation clock signal, and has a higher frequency than that of the oscillation clock signal CKSA.

The time-to-digital converter 56 outputs a digital value DG11 based on the oscillation clock signal CKSA and the oscillation clock signal CKF1. The digital value DG11 is a first digital value for the first signal. For example, the time-to-digital converter 56 compares the phase of the oscillation clock signal CKSA with the phase of the oscillation clock signal CKF1, and obtains and outputs a digital value DG11 corresponding to the time difference between the transition timings of the signal STA and the oscillation clock signal CKF1.

The time-to-digital converter 57 outputs a digital value DG12 based on the oscillation clock signal CKSA and the oscillation clock signal CKF2. The digital value DG12 is a second digital value for the first signal. For example, the time-to-digital converter 57 compares the phase of the oscillation clock signal CKSA with the phase of the oscillation clock signal CKF2, and obtains and outputs a digital value DG12 corresponding to the time difference between the transition timings of the signal STA and the oscillation clock signal CKF2.

The time-to-digital converter 58 outputs a digital value DG13 based on the oscillation clock signal CKSA and the oscillation clock signal CKF3. The digital value DG13 is a third digital value for the first signal. For example, the time-to-digital converter 58 compares the phase of the oscillation clock signal CKSA with the phase of the oscillation clock signal CKF3, and obtains and outputs a digital value DG13 corresponding to the time difference between the transition timings of the signal STA and the oscillation clock signal CKF3.

Further, the processing circuit 80 uses any one of the digital values DG11, DG12, and DG13 as the digital value DG1 described with reference to FIGS. 1 and 2. In this way, a clock signal suitable for measuring a time difference with the transition timing of the signal STA among the clock signals TCK1, TCK2, and TCK3 can be selected, and the time difference can be measured. For example, when the time difference between the transition timings of the signal STA and the clock signal TCK1 is the smallest, the processing circuit 80 selects the digital value DG11 corresponding to the clock signal TCK1 and uses the selected value as a digital value DG1 that represents the time difference with the transition timing of the signal STA. Similarly, when the time difference between the transition timings of the signal STA and the clock signal TCK2 is the smallest, the processing circuit 80 selects the digital value DG12 corresponding to the clock signal TCK2 and uses the selected value as a digital value DG1. Further, when the time difference between the transition timings of the signal STA and the clock signal TCK3 is the smallest, the digital value DG13 corresponding to the clock signal TCK3 is selected and used as the digital value DG1.

For example, the processing circuit 80 determines which one of the digital values DG11, DG12, and DG13 is to be used as the digital value DG1 based on the signal levels of the plurality of multi-phase clock signals PCK1 to PCK9 at the transition timing of the signal STA. In this way, by monitoring the signal levels of the multi-phase clock signals PCK1 to PCK9 at the transition timing of the signal STA, a clock signal suitable for measuring a time difference with the transition timing of the signal STA among the clock signals TCK1, TCK2, and TCK3 can be selected, and the time difference can be measured. The details of the clock signal selection method will be described later with reference to FIGS. 11 to 14.

As shown in FIG. 7, the time-to-digital conversion circuit 40 includes a stop oscillation circuit 60, oscillation circuits 62, 63, and 64, and time-to-digital converters 66, 67, and 68. The stop oscillation circuit 60 is an oscillation circuit for the second signal, and the oscillation circuits 62, 63, and 64 are a fourth oscillation circuit, a fifth oscillation circuit, and a sixth oscillation circuit, respectively. These are ring-type oscillation circuits. Further, the time-to-digital converters 66, 67, and 68 are a fourth time-to-digital converter, a fifth time-to-digital converter, and a sixth time-to-digital converter, respectively.

The stop oscillation circuit 60 starts oscillation at the transition timing of the signal STP and generates an oscillation clock signal CKSP which is the oscillation clock signal for the second signal.

The oscillation circuit 62 starts oscillation at the transition timing of the clock signal TCK1, and generates an oscillation clock signal CKF4 having a frequency different from that of the oscillation clock signal CKSP. The oscillation clock signal CKF4 is a fourth oscillation clock signal, and has a higher frequency than that of the oscillation clock signal CKSP. The oscillation circuit 63 starts oscillation at the transition timing of the clock signal TCK2, and generates an oscillation clock signal CKF5 having a frequency different from that of the oscillation clock signal CKSP. The oscillation clock signal CKF5 is a fifth oscillation clock signal, and has a higher frequency than that of the oscillation clock signal CKSP. The oscillation circuit 64 starts oscillation at the transition timing of the clock signal TCK3, and generates an oscillation clock signal CKF6 having a frequency different from that of the oscillation clock signal CKSP. The oscillation clock signal CKF6 is a sixth oscillation clock signal, and has a higher frequency than that of the oscillation clock signal CKSP.

The time-to-digital converter 66 outputs a digital value DG21 based on the oscillation clock signal CKSP and the oscillation clock signal CKF4. The digital value DG21 is a first digital value for the second signal. The time-to-digital converter 67 outputs a digital value DG22 based on the oscillation clock signal CKSP and the oscillation clock signal CKF5. The digital value DG22 is a second digital value for the second signal. The time-to-digital converter 68 outputs a digital value DG23 based on the oscillation clock signal CKSP and the oscillation clock signal CKF6. The digital value DG23 is a third digital value for the second signal.

Further, the processing circuit 80 uses any one of the digital values DG21, DG22, and DG23 as the digital value DG2 described with reference to FIGS. 1 and 2. In this way, a clock signal suitable for measuring a time difference with the transition timing of the signal STP among the clock signals TCK1, TCK2, and TCK3 can be selected, and the time difference can be obtained. For example, when the time difference between the transition timings of the signal STP and the clock signal TCK1 is the smallest, the processing circuit 80 selects the digital value DG21 corresponding to the clock signal TCK1 and uses the selected value as a digital value DG2 that represents the time difference with the transition timing of the signal STP. Similarly, when the time difference between the transition timings of the signal STP and the clock signal TCK2 is the smallest, the processing circuit 80 selects the digital value DG22 corresponding to the clock signal TCK2 and uses the selected value as a digital value DG2. Further, when the time difference between the transition timings of the signal STP and the clock signal TCK3 is the smallest, the digital value DG23 corresponding to the clock signal TCK3 is selected and used as the digital value DG2.

For example, the processing circuit 80 determines which one of the digital values DG21, DG22, and DG23 is to be used as the digital value DG2 based on the signal levels of the plurality of multi-phase clock signals PCK1 to PCK9 at the transition timing of the signal STP. In this way, by monitoring the signal levels of the multi-phase clock signals PCK1 to PCK9 at the transition timing of the signal STP, a clock signal suitable for measuring a time difference with the transition timing of the signal STP among the clock signals TCK1, TCK2, and TCK3 can be selected, and the time difference can be measured.

Figure 8:
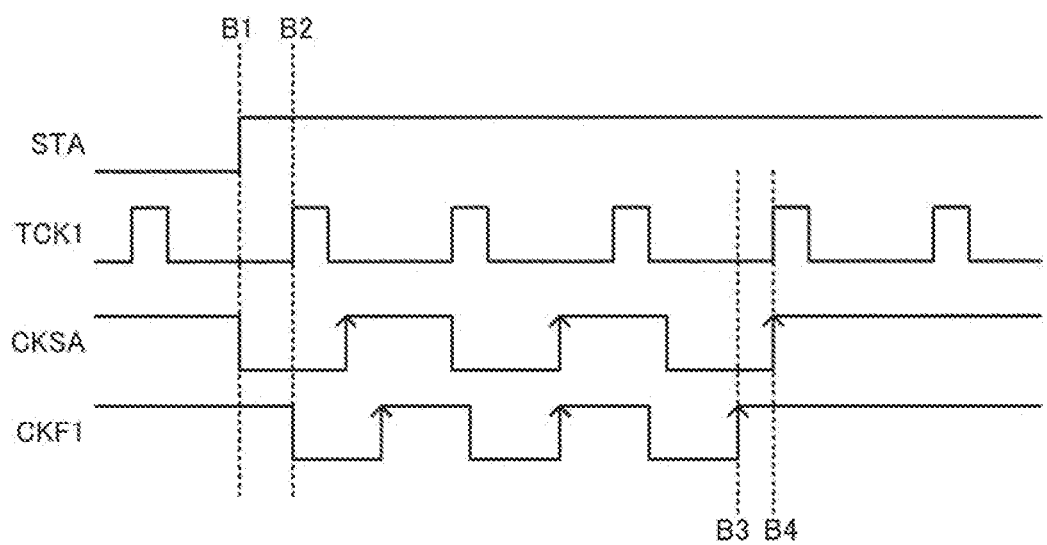
FIG. 8 is a signal waveform diagram for explaining processing of measuring a time difference of transition timing by utilizing a frequency difference between oscillation clock signals.

FIG. 8 is a signal waveform diagram for explaining processing of measuring the time difference between the transition timings of the signal STA and the clock signal TCK1 utilizing the frequency difference between the oscillation clock signals CKSA and CKF1. As shown by B1 in FIG. 8, the start oscillation circuit 50 that generates the oscillation clock signal CKSA starts oscillation at the transition timing of the signal STA. Further, as shown by B2, the oscillation circuit 52 that generates the oscillation clock signal CKF1 starts oscillation at the transition timing of the clock signal TCK1. In this case, since the oscillation clock signal CKF1 has a higher frequency than that of the oscillation clock signal CKSA, in B3 and B4, the rising edge of the oscillation clock signal CKF1 passes the rising edge of the oscillation clock signal CKSA and changes to the H level. By counting the number of clocks until the rising edge of the oscillation clock signal CKF1 passes, the time difference between the transition timings of the signal STA and the clock signal TCK1 can be measured with the resolution corresponding to the frequency difference between the oscillation clock signals CKSA and CKF1. The time difference between the transition timings of the signal STA and the clock signals TCK2 and TCK3 can be measured in the same manner.

Figure 9:
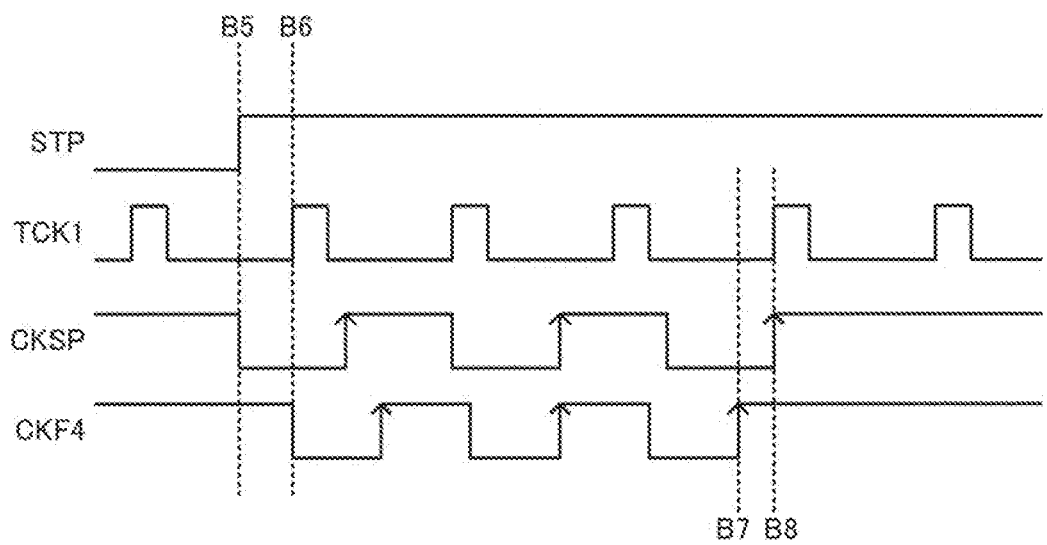
FIG. 9 is a signal waveform diagram for explaining processing of measuring a time difference of transition timing by utilizing a frequency difference between oscillation clock signals.

FIG. 9 is a signal waveform diagram for explaining processing of measuring the time difference between the transition timings of the signal STP and the clock signal TCK1 utilizing the frequency difference between the oscillation clock signals CKSP and CKF1. As shown by B5 in FIG. 9, the stop oscillation circuit 60 that generates the oscillation clock signal CKSP starts oscillation at the transition timing of the signal STP. Further, as shown by B6, the oscillation circuit 62 that generates the oscillation clock signal CKF4 starts oscillation at the transition timing of the clock signal TCK1. In this case, since the oscillation clock signal CKF4 has a higher frequency than that of the oscillation clock signal CKSP, in B7 and B9, the rising edge of the oscillation clock signal CKF4 passes the rising edge of the oscillation clock signal CKSP and changes to the H level. By counting the number of clocks until the rising edge of the oscillation clock signal CKF4 passes, the time difference between the transition timings of the signal STP and the clock signal TCK1 can be measured with the resolution corresponding to the frequency difference between the oscillation clock signals CKSP and CKF4. The time difference between the transition timings of the signal STP and the clock signals TCK2 and TCK3 can be measured in the same manner.

It is desirable to provide an adjustment circuit that measures the frequency of the oscillation clock signals CKSA, CKSP, and CKF1 to CKF6, and adjusts the frequency to become the target frequency as in JP-A-2019-39882 described above. For example, the delay time of the delay elements of the start oscillation circuit 50, stop oscillation circuit 60, oscillation circuits 52, 53, 54, 62, 63, and 64, which are ring-type oscillation circuits, is adjusted by the adjustment circuit. In this way, it is possible to improve the accuracy of measuring the time difference.

Figure 10:
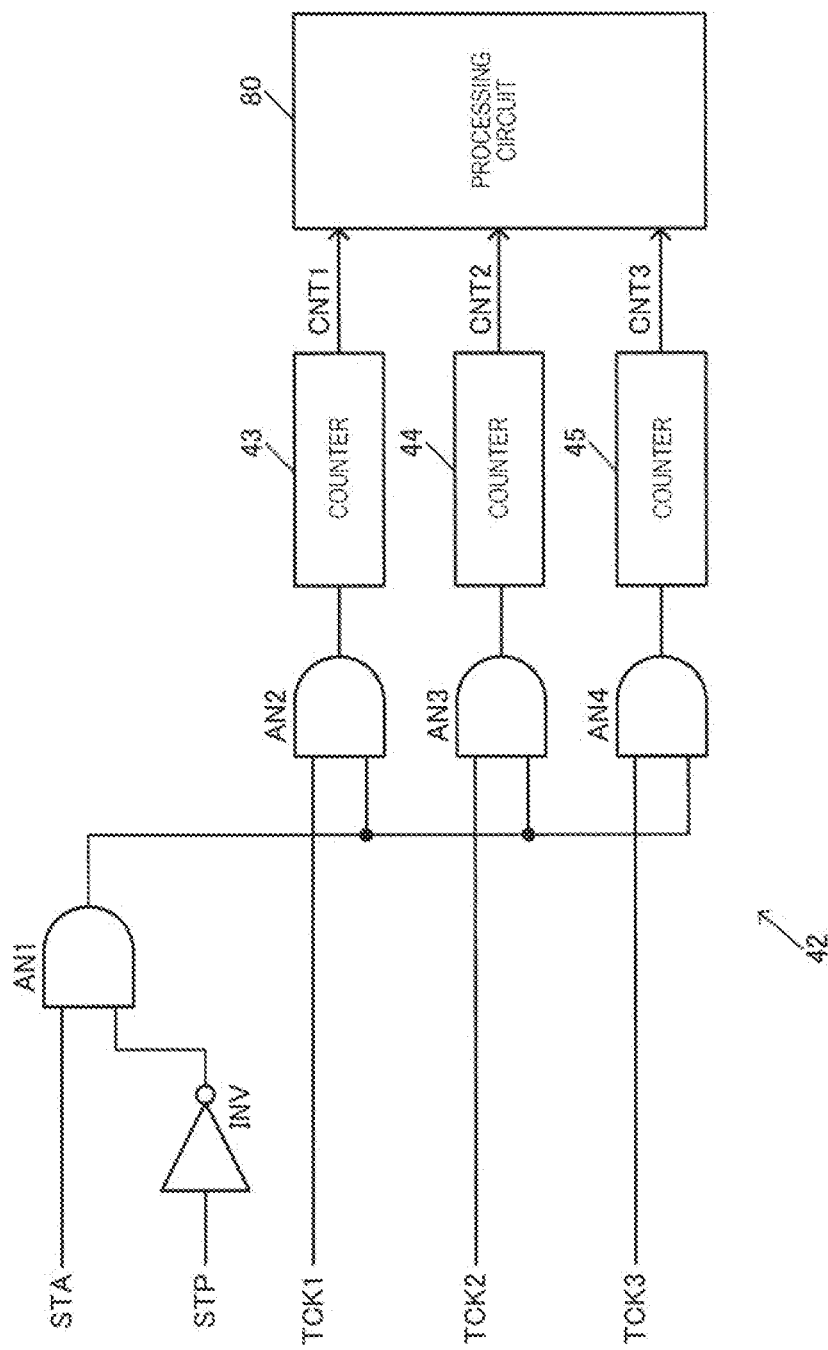
FIG. 10 shows a configuration example of a count circuit.

FIG. 10 shows a configuration example of the count circuit 42. The count circuit 42 includes counters 43, 44, and 45. Further, the count circuit 42 can include AND circuits AN1, AN2, AN3, and AN4, and an inverter INV. The counter 43 is a first counter, the counter 44 is a second counter, and the counter 45 is a third counter.

The counter 43 performs the count operation from the transition timing of the signal STA to the transition timing of the signal STP based on the clock signal TCK1, and outputs a count value CNT1. The count value CNT1 is a first count value. The counter 44 performs the count operation from the transition timing of the signal STA to the transition timing of the signal STP based on the clock signal TCK2, and outputs a count value CNT2. The count value CNT2 is a second count value. The counter 45 performs the count operation from the transition timing of the signal STA to the transition timing of the signal STP based on the clock signal TCK3, and outputs a count value CNT3. The count value CNT3 is a third count value. That is, during the period when the signal STA is at the H level and the signal STP is at the L level, the output of the AND circuit AN1 is at the H level, and the clock signals TCK1, TCK2, and TCK3 are input to the counters 43, 44, and 45 via the AND circuits AN1, AN2, and AN3.

Accordingly, during the period from the timing when the signal STA transitions from the L level to the H level to the timing when the signal STP transitions from the L level to the H level, the counters 43, 44, and 45 perform count operations based on the clock signals TCK1, TCK2, and TCK3, respectively. The count values CNT1, CNT2, and CNT3, which are the count results, are output to the processing circuit 80. Thereby, the result of measuring the time difference between the transition timings of the signal STA and the signal STP by the count operation of the clock signals TCK1, TCK2, and TCK3 with a coarse resolution can be output to the processing circuit 80 as the count values CNT1, CNT2, and CNT3.

The processing circuit 80 uses any one of the count values CNT1, CNT2, and CNT3 as the count value CNT described with reference to FIGS. 1 and 2. In this way, a clock signal suitable for the count processing to measure a time difference between the signal STA and the signal STP among the clock signals TCK1, TCK2, and TCK3 can be selected, and the time difference can be measured. For example, when the transition timing of the signal STA or the signal STP coincides with the transition timing of the clock signal, the count value is shifted by one clock, and an error occurs. In this regard, according to the configuration of the count circuit 42 in FIG. 10, a clock signal that does not coincide with the transition timing of the signal STA or the signal STP is selected from the clock signals TCK1, TCK2, and TCK3, and the count value based on the clock signal can be used as the count value CNT representing the time difference of the transition timing between the signal STA and the signal STP.

For example, the processing circuit 80 determines which one of the count values CNT1, CNT2, and CNT3 is to be used as the count value CNT based on the signal levels of the plurality of multi-phase clock signals PCK1 to PCK9 at the transition timing of the signal STA. In this way, by monitoring the signal levels of the multi-phase clock signals PCK1 to PCK9 at the transition timing of the signal STA, a clock signal suitable for the count processing to measure a time difference between the transition timings of the signal STA and the signal STP among the clock signals TCK1, TCK2, and TCK3 can be selected, and the time difference can be measured.

Figure 11:
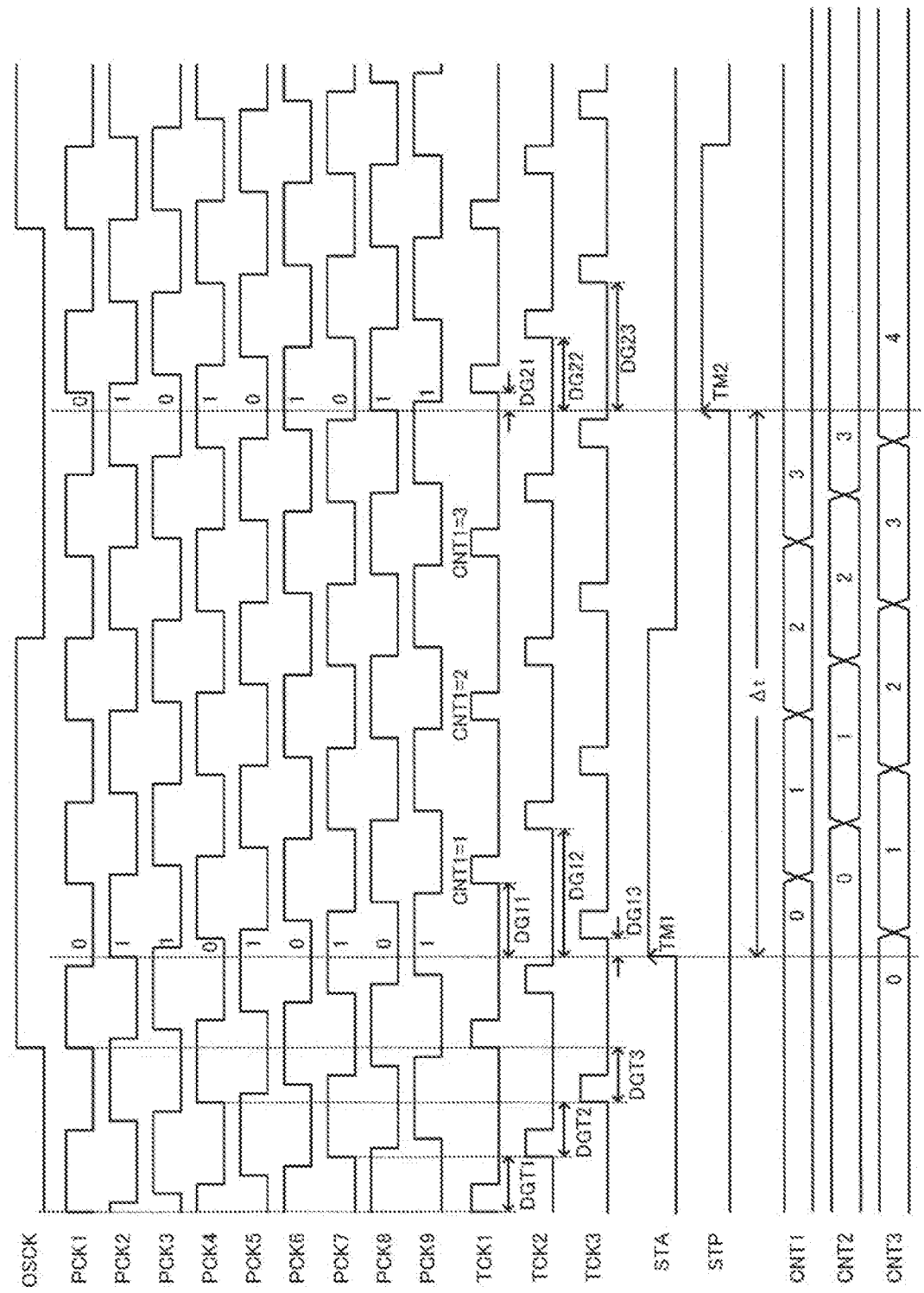
FIG. 11 is a signal waveform diagram for explaining an operation of the present embodiment in detail.

FIG. 11 is a signal waveform diagram for explaining an operation example of the present embodiment in detail. In FIG. 11, a time difference Δt between the transition timing TM1 of the signal STA and the transition timing TM2 of the signal STP is measured. As shown in FIG. 11, the counters 43, 44, and 45 in FIG. 10 perform count operations of the count values CNT1, CNT2, and CNT3 based on the clock signals TCK1, TCK2, and TCK3. The processing circuit 80 selects the count value CNT1 based on the clock signal TCK1 based on the signal level information "011010101" of the multi-phase clock signals PCK1 to PCK9 at the transition timing TM1 of the signal STA as a coarse measurement result of the time difference Δt. That is, the coarse measurement result of the time difference Δt is measured as CNT1=3.

Further, in FIG. 11, DGT1, DGT2, and DGT3 are digital values corresponding to the periods of the clock signals TCK1, TCK2, and TCK3, respectively, and are known values. DG11, DG12, and DG13 are digital values corresponding to the time differences between the transition timings of the signal STA, and the clock signals TCK1, TCK2, and TCK3, respectively, and are obtained by the time-to-digital converters 56, 57, and 58 as shown in FIG. 7. DG21, DG22, and DG23 are digital values corresponding to the time differences between the transition timings of the signal STP, and the clock signals TCK1, TCK2, and TCK3, respectively, and are obtained by the time-to-digital converters 66, 67, and 68 as shown in FIG. 7. The processing circuit 80 obtains the time difference Δt based on, for example, the following equation (1).

$$\Delta t = CNT1 \times RSLC + (DG13 - DG21) \times RSLF + DGT3 \qquad (1)$$

In the above equation (1), RSLC is a coarse resolution of time measurement, and is a resolution corresponding to the frequency of the clock signals TCK1, TCK2, and TCK3. For example, when the frequency of the clock signals TCK1, TCK2, and TCK3 is fc=500 MHz, it is expressed as RSCL=1/fs=2 ns. RSLF is a fine resolution of time measurement, and for example, when it is assumed that the frequency of the oscillation clock signals CKF1 to CKF6 is f1 and the frequency of the oscillation clock signals CKSA and CKSP is f2, it can be expressed as RSLF=(f1−f2)/f1×f2.

Since DGT3 is a known value in the above equation (1), the time difference Δt can be obtained by measuring the count value CNT1, the digital values DG13 and DG21. In FIG. 11, CNT1 is a count value based on the clock signal TCK1, and is the count value of the counter 43 in FIG. 10. DG13 is a digital value corresponding to a time difference between the transition timings of the signal STA and the clock signal TCK3, and is measured by the start oscillation circuit 50, the oscillation circuit 54, and the time-to-digital converter 58 in FIG. 7. This digital value DG13 corresponds to the digital value DG1 in FIG. 2. DG21 is a digital value corresponding to the time difference between the transition timings of the signal STP and the clock signal TCK1, and is measured by the stop oscillation circuit 60, the oscillation circuit 62, and the time-to-digital converter 66 in FIG. 7. This digital value DG21 corresponds to the digital value DG2 in FIG. 2.

As described above, in the present embodiment, a coarse measurement value of the time difference Δt is measured by the count value of the count operation of any one of the clock signals TCK1, TCK2, and TCK3. In FIG. 11, the coarse measurement value of the time difference Δt is obtained from the count value CNT1 of the clock signal TCK1. Specifically, for example, the count value CNT1 is selected from the count values CNT1 to CNT3 based on "011010101" which is information about the signal levels of the multi-phase clock signals PCK1 to PCK9 at the transition timing of the signal STA.

On the other hand, a fine measurement value of the time difference Δt is measured by the time difference between the transition timings of the signal STA, and any one of the clock signals TCK1, TCK2, and TCK3, and by the time difference between the transition timings of the signal STP, and any one of the clock signals TCK1, TCK2, and TCK3. In FIG. 11, the fine measurement value of the time difference Δt is obtained from the digital value DG13 corresponding to the time difference between the transition timings of the signal STA and the clock signal TCK3 and the digital value DG21 corresponding to the time difference between the transition timings of the signal STP and the clock signal TCK1. Specifically, based on "011010101" which is information about the signal levels of the multi-phase clock signals PCK1 to PCK9 at the transition timing of the signal STA, it is determined that the clock signal of the transition timing closest to the transition timing of the signal STA is TCK3, and the digital value DG13 corresponding to the clock signal TCK3 is selected. Further, based on "010101011" which is information about the signal levels of the multi-phase clock signals PCK1 to PCK9 at the transition timing of the signal STP, it is determined that the clock signal of the transition timing closest to the transition timing of the signal STP is TCK1, and the digital value DG21 corresponding to the clock signal TCK1 is selected. In this way, by selecting the digital value corresponding to the clock signal of the transition timing closest to the transition timing of the signal STA or the signal STP, it is possible to reduce the adverse effect of the accumulated jitter of the oscillation clock signal, and it is possible to improve the accuracy of time-to-digital conversion.

Figure 12:
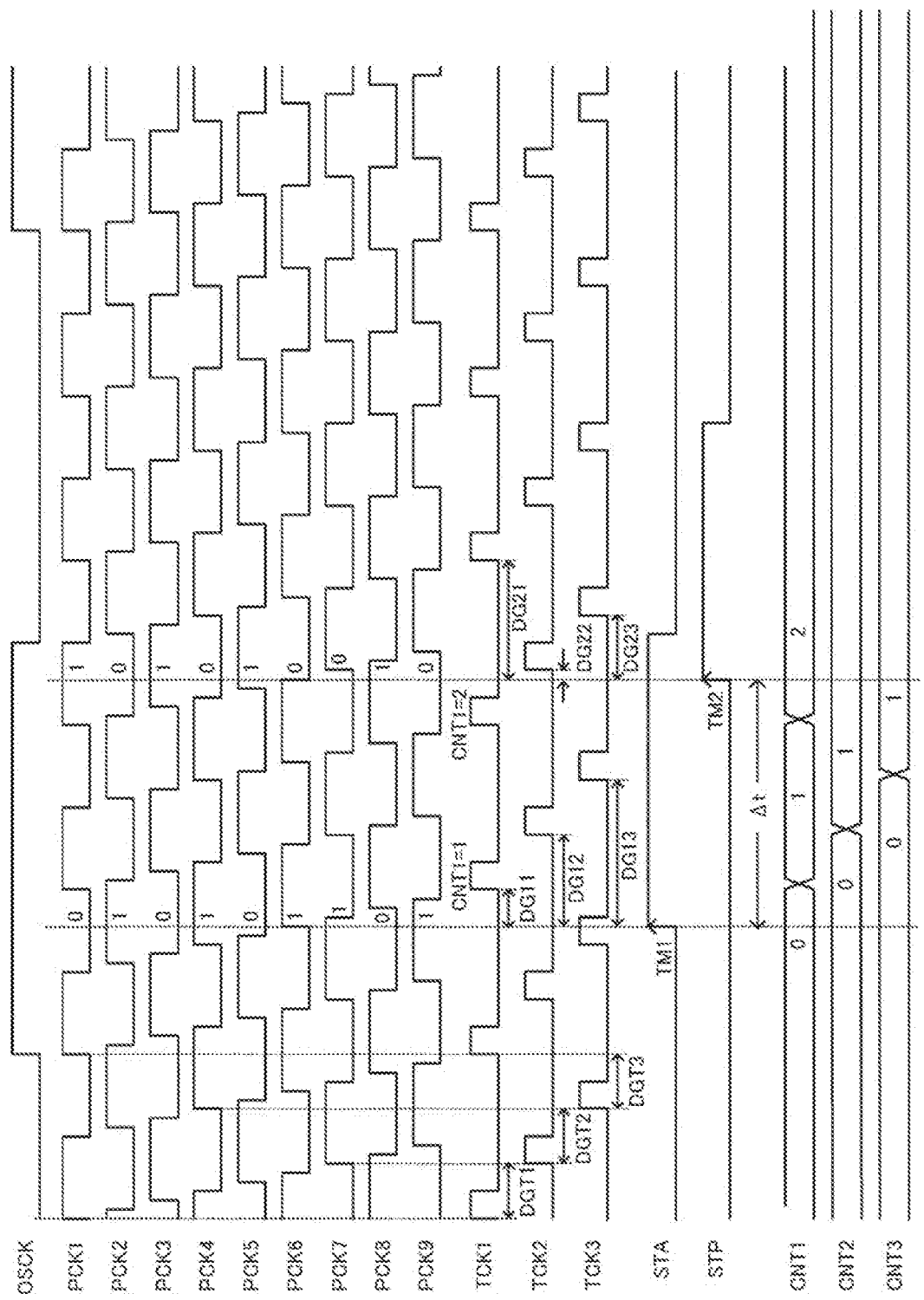
FIG. 12 is a signal waveform diagram for explaining an operation of the present embodiment in detail.

FIG. 12 is a signal waveform diagram for explaining another operation example of the present embodiment in detail. In FIG. 12, the processing circuit 80 selects the count value CNT1 based on the clock signal TCK1 based on the signal level information "010101101" of the multi-phase clock signals PCK1 to PCK9 at the transition timing TM1 of the signal STA as a coarse measurement result of the time difference Δt. That is, the coarse measurement result of the time difference Δt is measured as CNT1=2. The processing circuit 80 obtains the time difference Δt based on, for example, the following equation (2).

$$\Delta t = CNT1 \times RSLC + (DG11 - DG22) \times RSLF + DGT1 \quad (2)$$

Since DGT1 is a known value in the above equation (2), the time difference Δt can be obtained by measuring the count value CNT1, the digital values DG11 and DG22. In FIG. 12, CNT1 is a count value based on the clock signal TCK1, and is the count value of the counter 43 in FIG. 10. DG11 is a digital value corresponding to a time difference between the transition timings of the signal STA and the clock signal TCK1, and is measured by the start oscillation circuit 50, the oscillation circuit 52, and the time-to-digital converter 56 in FIG. 7. This digital value DG11 corresponds to the digital value DG1 in FIG. 2. DG22 is a digital value corresponding to the time difference between the transition timings of the signal STP and the clock signal TCK2, and is measured by the stop oscillation circuit 60, the oscillation circuit 63, and the time-to-digital converter 67 in FIG. 7. This digital value DG22 corresponds to the digital value DG2 in FIG. 2.

As described above, in FIG. 12, the coarse measurement value of the time difference Δt is obtained from the count value CNT1 of the clock signal TCK1. Specifically, for example, the count value CNT1 is selected from the count values CNT1 to CNT3 based on "010101101" which is information about the signal levels of the multi-phase clock signals PCK1 to PCK9 at the transition timing of the signal STA.

On the other hand, the fine measurement value of the time difference Δt is obtained from the digital value DG11 corresponding to the time difference between the transition timings of the signal STA and the clock signal TCK1 and the digital value DG22 corresponding to the time difference between the transition timings of the signal STP and the clock signal TCK2. Specifically, based on "010101101" which is information about the signal levels of the multi-phase clock signals PCK1 to PCK9 at the transition timing of the signal STA, it is determined that the clock signal of the transition timing closest to the transition timing of the signal STA is TCK1, and the digital value DG11 corresponding to the clock signal TCK1 is selected. Further, based on "101010010" which is information about the signal levels of the multi-phase clock signals PCK1 to PCK9 at the transition timing of the signal STP, it is determined that the clock signal of the transition timing closest to the transition timing of the signal STP is TCK2, and the digital value DG22 corresponding to the clock signal TCK2 is selected. In this way, by selecting the digital value corresponding to the clock signal of the transition timing closest to the transition timing of the signal STA or the signal STP, it is possible to reduce the adverse effect of the accumulated jitter of the oscillation clock signal, and it is possible to improve the accuracy of time-to-digital conversion.

FIGS. 13 and 14 are explanatory diagrams for a selection method of a clock signal. The selection method of a clock signal when obtaining a coarse measurement value of the time difference Δt will be described here. In FIGS. 13 and 14, [1], [2], [3] . . . [9] correspond to the signal levels of the multi-phase clock signals PCK1 to PCK9 at the transition timing of the signal STA, and for example, are the latch signals LSTA [1:9] output from the latch circuit 24 in FIG. 4. As shown in FIGS. 11 and 12, in the even-numbered multi-phase clock signals, the signal level is inverted with respect to the odd-numbered multi-phase clock signals. Therefore, in order to make the explanation easy to understand, in FIG. 14, the logic levels of the latch signals LSTA [1:9] corresponding to the even-numbered multi-phase clock signals are inverted.

For example, No. 12 in FIGS. 13 and 14 is a case where the signal STA transitions between the rising edge of the multi-phase clock signal PCK2 and the falling edge of the multi-phase clock signal PCK3. In this case, as is clear from FIGS. 11 and 12, by selecting the clock signal TCK1 corresponding to the multi-phase clock signal PCK1, the transition timings of the signal STA and the clock signal TCK1 do not overlap, and thus an appropriate count operation can be realized. Similarly, in the cases of No13, No14, No15, No16, and No17, the clock signal TCK1 is selected. For example, No. 17 is a case where the signal STA transitions between the falling edge of the multi-phase clock signal PCK7 and the rising edge of the multi-phase clock signal PCK8, and by using the clock signal TCK1 corresponding to the multi-phase clock signal PCK1, an appropriate count operation can be realized.

Further, No. 0 in FIGS. 13 and 14 is a case where the signal STA transitions between the rising edge of the multi-phase clock signal PCK8 and the falling edge of the multi-phase clock signal PCK9. In this case, as is clear from FIGS. 11 and 12, by selecting the clock signal TCK2 corresponding to the multi-phase clock signal PCK7, an appropriate count operation can be realized. Similarly, in the case of No1, No2, NO3, No4, and No5, the clock signal TCK2 is selected. For example, No. 5 is a case where the signal STA transitions between the falling edge of the multi-phase clock signal PCK4 and the rising edge of the multi-phase clock signal PCK5, and by using the clock signal TCK2 corresponding to the multi-phase clock signal PCK7, an appropriate count operation can be realized.

Further, No. 6 in FIGS. 13 and 14 is a case where the signal STA transitions between the rising edge of the multi-phase clock signal PCK5 and the falling edge of the multi-phase clock signal PCK6. In this case, as is clear from FIGS. 11 and 12, by selecting the clock signal TCK3 corresponding to the multi-phase clock signal PCK4, an appropriate count operation can be realized. Similarly, in the case of No7, No8, N09, No10, and No11, the clock signal TCK3 is selected. For example, No. 11 is a case where the signal STA transitions between the falling edge of the multi-phase clock signal PCK1 and the rising edge of the multi-phase clock signal PCK2, and by using the clock signal TCK3 corresponding to the multi-phase clock signal PCK4, an appropriate count operation can be realized.

As described above, by monitoring the signal levels of the multi-phase clock signals PCK1 to PCK9 at the transition timing of the signal STA, a clock signal suitable for the count operation of the count value can be selected. Similarly, by monitoring the signal levels of the multi-phase clock signals PCK1 to PCK9 at the transition timing of the signal STA or the signal STP, a clock signal that changes at the transition timing closest to the transition timing of the signal STA or the signal STP can be selected.

3. Physical Quantity Measuring Device, Electronic Apparatus, and Vehicle

Figure 15:
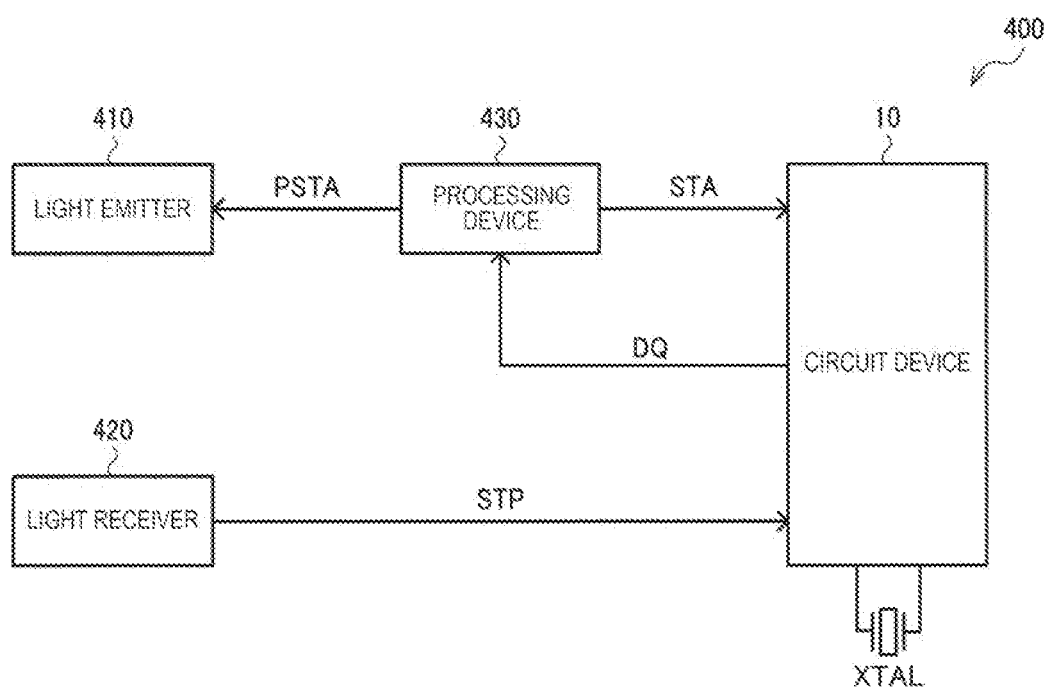
FIG. 15 shows a configuration example of a physical quantity measuring device.

FIG. 15 shows a configuration example of the physical quantity measuring device 400 of the present embodiment. The physical quantity measuring device 400 includes the circuit device 10 of the present embodiment and a processing device 430 that performs processing based on the digital value DQ from the circuit device 10. A resonator XTAL for generating a clock signal serving as a reference for time-to-digital conversion is coupled to the circuit device 10. The processing device 430 performs various processing utilizing the time-to-digital conversion based on the digital value DQ that is the result of the time-to-digital conversion from the circuit device 10. Further, the physical quantity measuring device 400 can include a light emitter 410 and a light receiver 420 that receives light reflected from a target object. The light emitter 410 is a light source, and the light receiver 420 is a light receiving sensor. The processing device 430 is realized by a processor such as a CPU or a memory, and outputs a light emission control signal PSTA to the light emitter 410.

The light emitter 410 emits light based on the light emission control signal PSTA from the processing device 430, the light emission control signal PSTA is input to the circuit device 10 as a signal STA, and the light receiving signal of the light receiver 420 is input to the circuit device 10 as a signal STP. In this way, a distance measuring device using TOF method that measures the distance to the target object as a physical quantity can be realized. The light emission control signal PSTA may be a signal input from outside the physical quantity measuring device 400.

Figure 16:
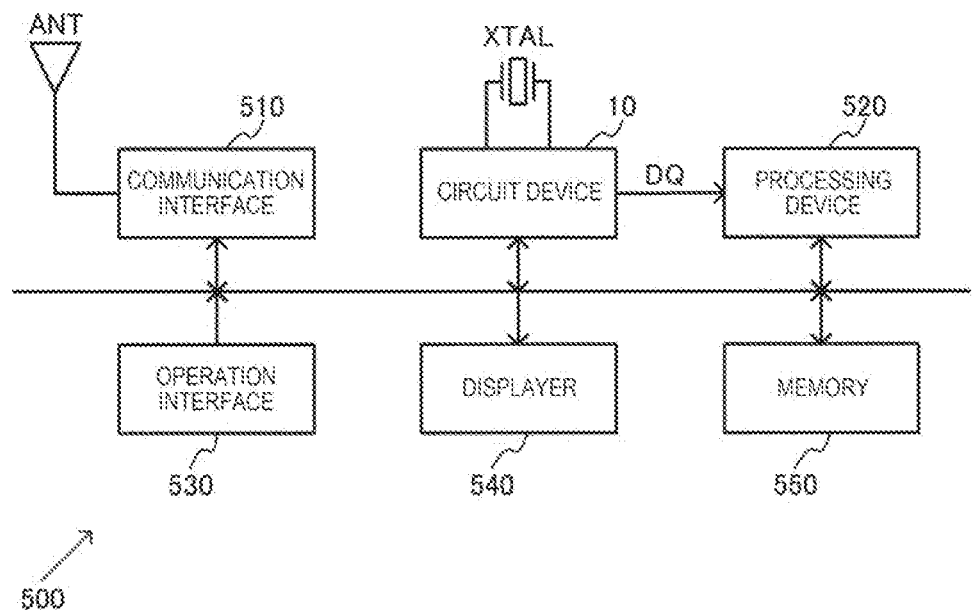
FIG. 16 shows a configuration example of an electronic apparatus.

FIG. 16 shows a configuration example of an electronic apparatus 500 according to the present embodiment. The electronic apparatus 500 includes the circuit device 10 of the present embodiment and a processing device 520 that performs processing based on the digital value DQ from the circuit device 10. A resonator XTAL for generating a clock signal serving as a reference for time-to-digital conversion is coupled to the circuit device 10. The processing device 520 performs various processing utilizing the time-to-digital conversion based on the digital value DQ that is the result of the time-to-digital conversion from the circuit device 10. The electronic apparatus 500 can include a communication interface 510, an operation interface 530, a displayer 540, a memory 550, and an antenna ANT.

The electronic apparatus 500 is, for example, a measuring apparatus for measuring a physical quantity such as distance, time, flow velocity, or flow rate, a biological information measuring apparatus for measuring biological information, an in-vehicle apparatus, or a network-related apparatus such as a base station or a router. The biological information measuring apparatus is, for example, an ultrasonic measuring device, a pulse wave meter, a blood pressure measuring device, or the like. The in-vehicle apparatus is, for example, an apparatus for automatic driving or the like. The electronic apparatus 500 may be a wearable apparatus such as a head mounted type display device or a timepiece related apparatus, a mobile information terminal such as a robot, a printing device, a projection device, a smartphone, a content providing apparatus that delivers content, a video apparatus such as a digital camera or a video camera, or the like.

The communication interface 510 performs processing of receiving data from the outside via the antenna ANT and transmitting data to the outside. The processing device 520 performs control processing of the electronic apparatus 500, various digital processing of data transmitted and received via the communication interface 510, or the like. The function of the processing device 520 can be realized, for example, by a processor such as a microcomputer. The operation interface 530 is for a user to perform an input operation, and can be realized by an operation button, a touch panel display, or the like. The displayer 540 displays various information, and can be realized by a display such as a liquid crystal display or an organic EL display. The memory 550 stores data, and the function can be realized by a semiconductor memory such as a RAM or a ROM.

Figure 17:
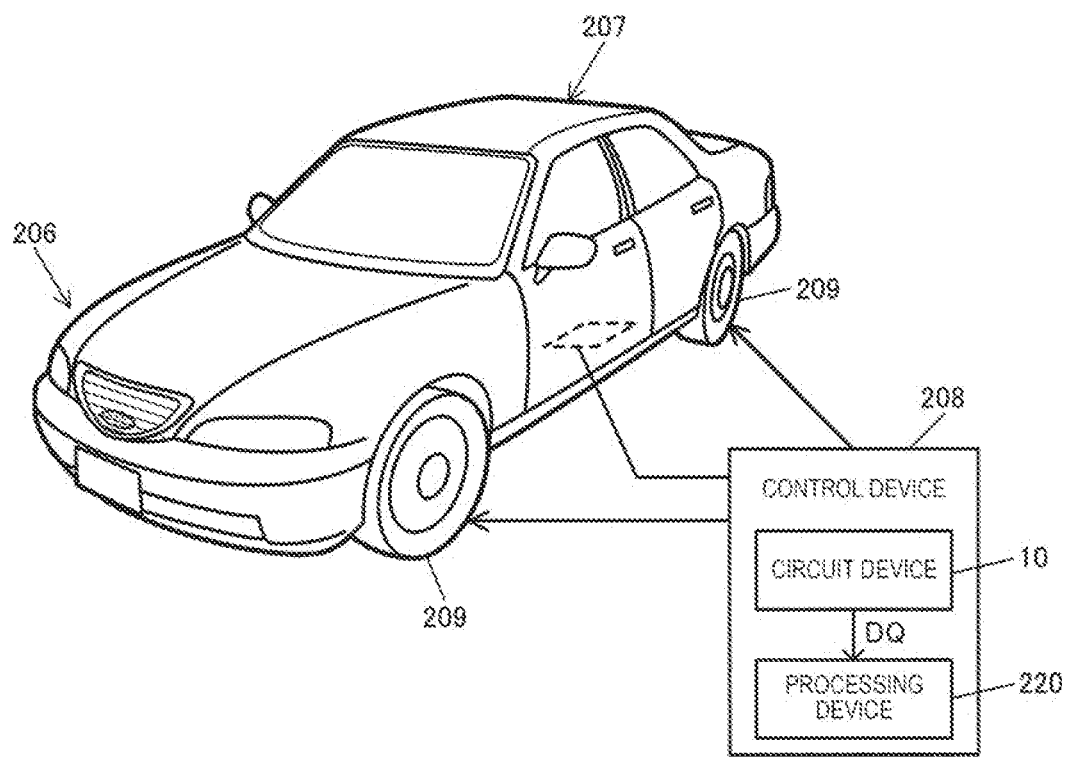
FIG. 17 shows a configuration example of a vehicle.

FIG. 17 shows an example of a vehicle including the circuit device 10 of the present embodiment. The vehicle includes the circuit device 10 and a processing device 220 that performs processing based on the digital value DQ from the circuit device 10. The processing device 220 performs various processing utilizing the time-to-digital conversion based on the digital value DQ that is the result of the time-to-digital conversion from the circuit device 10. For example, processing for automatic driving is executed. The circuit device 10 of the present embodiment can be incorporated into various vehicles such as cars, airplanes, motorcycles, bicycles, robots, or ships. The vehicle is an apparatus/device that moves on the ground, in the sky, or on the sea, and includes a driving mechanism such as an engine or a motor, a steering mechanism such as a steering wheel or a rudder, and various electronic apparatuses such as in-vehicle apparatus. FIG. 17 schematically shows an automobile 206 as a specific example of the vehicle. The control device 208 including the circuit device 10 of the present embodiment is incorporated in the automobile 206. The control device 208 performs various control processing based on physical quantity information obtained by utilizing the time-to-digital conversion of the circuit device 10. For example, when the distance information of an object around the automobile 206 is measured as the physical quantity information, the control device 208 performs various control processing for automatic driving using the measured distance information. The control device 208, for example, controls the hardness of the suspension according to the posture of a vehicle body 207, and controls brakes of the individual wheels 209. The apparatus in which the circuit device 10 of the present embodiment is incorporated is not limited to such a control device 208, but can be incorporated in various apparatuses provided in a vehicle such as an automobile 206 or a robot.

As described above, the circuit device of the present embodiment includes a clock signal generation circuit that generates a plurality of multi-phase clock signals having the same frequency and different phases from each other. The circuit device also includes: a time-to-digital conversion circuit performing a count operation based on an i-th clock signal that corresponds to any multi-phase clock signal of the plurality of multi-phase clock signals, to obtain a count value that corresponds to a time difference between a transition timing of a first signal and a transition timing of a second signal, to obtain a first digital value that corresponds to a time difference from the transition timing of the first signal to a transition timing of a j-th clock signal that corresponds to any multi-phase clock signal of the plurality of multi-phase clock signals, and to obtain a second digital value that corresponds to a time difference from the transition timing of the second signal to a transition timing of a k-th clock signal that corresponds to any multi-phase clock signal of the plurality of multi-phase clock signals; and a processing circuit obtaining a digital value that corresponds to the time difference between the transition timing of the first signal and the transition timing of the second signal based on the count value, the first digital value, and the second digital value.

According to the present embodiment, the plurality of multi-phase clock signals having the same frequency and different phases from each other are generated. The count operation based on the i-th clock signal is performed, and the count value corresponding to the time difference between transition timings of the first signal and the second signal is obtained. Further, the first digital value corresponding to the time difference from the transition timing of the first signal to the transition timing of the j-th clock signal is obtained, and the second digital value corresponding to the time difference from the transition timing of the second signal to the transition timing of the kth clock signal is obtained. The digital value corresponding to the time difference between the transition timing of the first signal and the transition timing of the second signal is obtained based on the obtained count value, first digital value, and second digital value. In this way, by obtaining the count value by the count operation of the i-th clock signal, a coarse time measurement of the time difference is performed, and by obtaining the first digital value corresponding to the time difference between the transition timings of the first signal and the j-th clock signal and the second digital value corresponding to the time difference between the transition timings of the second signal and the k-th clock signal, a fine time measurement for the time difference is performed. Therefore, even when the time difference between the transition timings of the first signal and the second signal becomes longer, it is possible to cope with this, and it is possible to provide the circuit device that can suppress a decrease in measurement accuracy of time-to-digital conversion due to integration of clock jitters.

Further, in the present embodiment, the time-to-digital conversion circuit may include a count circuit that performs a count operation from the transition timing of the first signal to the transition timing of the second signal based on the i-th clock signal, and outputs the count value.

As described above, the count value corresponding to the time difference from the transition timing of the first signal to the transition timing of the second signal can be obtained, and the coarse time measurement of the time difference can be performed.

Further, in the present embodiment, the clock signal generation circuit may include a ring-type oscillation circuit that outputs the plurality of multi-phase clock signals from a plurality of intermediate nodes.

In this way, the plurality of multi-phase clock signals having the same frequency and different phases from each other can be output from the plurality of intermediate nodes of the ring-type oscillation circuit.

Further, in the present embodiment, the clock signal generation circuit may include a PLL circuit in which the ring-type oscillation circuit is provided as a voltage controlled oscillation circuit and that generates the plurality of multi-phase clock signals that are phase synchronized with a reference clock signal generated using a resonator.

In this way, by providing the PLL circuit in the clock signal generation circuit, a plurality of multi-phase clock signals synchronized with the reference clock signal can be generated, and the frequency of the multi-phase clock signal can be set to the frequency obtained by multiplying the frequency of the reference clock signal.

Further, in the present embodiment, the time-to-digital conversion circuit may include an oscillation circuit for the first signal that starts oscillation at the transition timing of the first signal and generates an oscillation clock signal for the first signal, a j-th oscillation circuit that starts the oscillation at the transition timing of the j-th clock signal and generates a j-th oscillation clock signal having a frequency different from a frequency of the oscillation clock signal for the first signal, a first time-to-digital converter that outputs the first digital value based on the oscillation clock signal for the first signal and the j-th oscillation clock signal. The time-to-digital conversion circuit may also include an oscillation circuit for the second signal that starts the oscillation at the transition timing of the second signal and generates an oscillation clock signal for the second signal, a k-th oscillation circuit that starts the oscillation at the transition timing of the k-th clock signal and generates a k-th oscillation clock signal having a frequency different from a frequency of the oscillation clock signal for the second signal, and a second time-to-digital converter that outputs the second digital value based on the oscillation clock signal for the second signal and the k-th oscillation clock signal.

In this way, the time difference between the transition timings of the first signal and the j-th clock signal can be measured with a resolution corresponding to the frequency difference between the oscillation clock signal for the first signal and the j-th oscillation clock signal, and output as the first digital value. In addition, the time difference between the transition timings of the second signal and the k-th clock signal can be measured with a resolution corresponding to the frequency difference between the oscillation clock signal for the second signal and the k-th oscillation clock signal, and output as the second digital value.

Further, in the present embodiment, the clock signal generation circuit may output a first clock signal corresponding to a first multi-phase clock signal of the plurality of multi-phase clock signals, a second clock signal corresponding to a second multi-phase clock signal, and a third clock signal corresponding to a third multi-phase clock signal, and each of the i-th clock signal, the j-th clock signal, and the k-th clock signal may be one of the first clock signal, the second clock signal, and the third clock signal.

In this way, the time-to-digital conversion circuit can output the count value, the first digital value, and the second digital value by using the first clock signal, the second clock signal, and the third clock signal output from the clock signal generation circuit.

Further, in the present embodiment, the time-to-digital conversion circuit may include a first counter that performs a count operation from the transition timing of the first signal to the transition timing of the second signal based on the first clock signal and outputs a first count value, a second counter that performs the count operation from the transition timing of the first signal to the transition timing of the second signal based on the second clock signal and outputs a second count value, and a third counter that performs the count operation from the transition timing of the first signal to the transition timing of the second signal based on the third clock signal and outputs a third count value. Further, the processing circuit may use any one of the first count value, the second count value, and the third count value as the count value.

In this way, a clock signal appropriate for the count processing for measuring a time difference between the first signal and the second signal is selected among the first clock signal, the second clock signal, and the third clock signal, and the time difference can be measured.

Further, in the present embodiment, the processing circuit may determine which one of the first count value, the second count value, and the third count value is used as the count value based on signal levels of the plurality of multi-phase clock signals at the transition timing of the first signal.

In this way, by monitoring the signal levels of the plurality of multi-phase clock signals at the transition timing of the first signal, a clock signal appropriate for the count processing for measuring a time difference between the first signal and the second signal is selected among the first clock signal, the second clock signal, and the third clock signal, and the time difference can be measured.

Further, in the present embodiment, the time-to-digital conversion circuit may include an oscillation circuit for the first signal that starts oscillation at the transition timing of the first signal and generates an oscillation clock signal for the first signal, a first oscillation circuit that starts the oscillation at a transition timing of the first clock signal and generates a first oscillation clock signal having a frequency different from a frequency of the oscillation clock signal for the first signal, a second oscillation circuit that starts the oscillation at a transition timing of the second clock signal and generates a second oscillation clock signal having a frequency different from the frequency of the oscillation clock signal for the first signal, and a third oscillation circuit that starts the oscillation at a transition timing of the third clock signal and generates a third oscillation clock signal having a frequency different from the frequency of the oscillation clock signal for the first signal. The time-to-digital conversion circuit may also include a first time-to-digital converter that outputs a first digital value for the first signal based on the oscillation clock signal for the first signal and the first oscillation clock signal, a second time-to-digital converter that outputs a second digital value for the first signal based on the oscillation clock signal for the first signal and the second oscillation clock signal, and a third time-to-digital converter that outputs a third digital value for the first signal based on the oscillation clock signal for the first signal and the third oscillation clock signal. Further, the processing circuit may use any one of the first digital value for the first signal, the second digital value for the first signal, and the third digital value for the first signal as the first digital value.

In this way, a clock signal appropriate for measuring a time difference with the transition timing of the first signal is selected among the first clock signal, the second clock signal, and the third clock signal, and the time difference can be measured, thereby, the accuracy of the time-to-digital conversion can be improved.

Further, in the present embodiment, the processing circuit may determine which one of the first digital value for the first signal, the second digital value for the first signal, and the third digital value for the first signal is used as the first digital value based on the signal levels of the plurality of multi-phase clock signals at the transition timing of the first signal.

In this way, by monitoring the signal levels of the plurality of multi-phase clock signals at the transition timing of the first signal, a clock signal appropriate for measuring the time difference with the transition timing of the first signal is selected, and the time difference can be measured.

Further, in the present embodiment, the time-to-digital conversion circuit may include an oscillation circuit for the second signal that starts the oscillation at the transition timing of the second signal and generates an oscillation clock signal for the second signal, a fourth oscillation circuit that starts the oscillation at the transition timing of the first clock signal and generates a fourth oscillation clock signal having a frequency different from a frequency of the oscillation clock signal for the second signal, a fifth oscillation circuit that starts the oscillation at the transition timing of the second clock signal and generates a fifth oscillation clock signal having a frequency different from the frequency of the oscillation clock signal for the second signal, a sixth oscillation circuit that starts the oscillation at the transition timing of the third clock signal and generates a sixth oscillation clock signal having a frequency different from the frequency of the oscillation clock signal for the second signal. The time-to-digital conversion circuit may also include a fourth time-to-digital converter that outputs a first digital value for the second signal based on the oscillation clock signal for the second signal and the fourth oscillation clock signal, a fifth time-to-digital converter that outputs a second digital value for the second signal based on the oscillation clock signal for the second signal and the fifth oscillation clock signal, and a sixth time-to-digital converter that outputs a third digital value for the second signal based on the oscillation clock signal for the second signal and the sixth oscillation clock signal. Further, the processing circuit may use any one of the first digital value for the second signal, the second digital value for the second signal, and the third digital value for the second signal as the second digital value.

In this way, a clock signal appropriate for measuring the time difference with the transition timing of the second signal is selected among the first clock signal, the second clock signal, and the third clock signal, and the time difference can be measured, thereby, the accuracy of the time-to-digital conversion can be improved.

Further, in the present embodiment, the processing circuit may determine which one of the first digital value for the second signal, the second digital value for the second signal, and the third digital value for the second signal is used as the second digital value based on the signal levels of the plurality of multi-phase clock signals at the transition timing of the second signal.

In this way, by monitoring the signal levels of the plurality of multi-phase clock signals at the transition timing of the second signal, a clock signal appropriate for measuring the time difference with the transition timing of the second signal is selected, and the time difference can be measured.

The present embodiment also relates to a physical quantity measuring device including the above-described circuit device and a processing device performing processing based on the digital value from the circuit device.

The present embodiment also relates to an electronic apparatus including the above-described circuit device and a processing device performing processing based on the digital value from the circuit device.

The present embodiment also relates to a vehicle including the above-described circuit device and a processing device performing processing based on the digital value from the circuit device.

Although the present embodiment has been described in detail as described above, it will be easily understood by those skilled in the art that many modifications can be made without departing from the novel matters and effects of the present disclosure. Accordingly, all such modification examples are intended to be included within the scope of the present disclosure. For example, a term described at least once together with a different term having a broader meaning or the same meaning in the specification or the drawings can be replaced with the different term in any part of the specification or the drawings. All combinations of the present embodiment and the modification examples are also included in the scope of the present disclosure. Further, the configuration and operation of the circuit device, the clock signal generation circuit, the time-to-digital conversion circuit, the processing circuit, the electronic apparatus, and the vehicle are not limited to those described in the present embodiment, and various modifications can be made.

What is claimed is:

1. A circuit device comprising:
   a clock signal generation circuit generating a plurality of multi-phase clock signals that have the same frequency and different phases from each other;
   a time-to-digital conversion circuit
      performing a count operation based on an i-th clock signal that corresponds to any multi-phase clock signal of the plurality of multi-phase clock signals, to obtain a count value that corresponds to a time difference between a transition timing of a first signal and a transition timing of a second signal, to obtain a first digital value that corresponds to a time difference from the transition timing of the first signal to a transition timing of a j-th clock signal that corresponds to any multi-phase clock signal of the plurality of multi-phase clock signals, and to obtain a second digital value that corresponds to a time difference from the transition timing of the second signal to a transition timing of a k-th clock signal that corresponds to any multi-phase clock signal of the plurality of multi-phase clock signals; and
   a processing circuit obtaining a digital value that corresponds to the time difference between the transition timing of the first signal and the transition timing of the second signal based on the count value, the first digital value, and the second digital value.

2. The circuit device according to claim 1, wherein the time-to-digital conversion circuit includes
   a count circuit that performs a count operation from the transition timing of the first signal to the transition timing of the second signal based on the i-th clock signal, and outputs the count value.

3. The circuit device according to claim 1, wherein the clock signal generation circuit includes
   a ring-type oscillation circuit that outputs the plurality of multi-phase clock signals from a plurality of intermediate nodes.

4. The circuit device according to claim 3, wherein the clock signal generation circuit includes
   a PLL circuit in which the ring-type oscillation circuit is provided as a voltage controlled oscillation circuit and that generates the plurality of multi-phase clock signals that are phase-synchronized with a reference clock signal generated using a resonator.

5. The circuit device according to claim 1, wherein the time-to-digital conversion circuit includes
   an oscillation circuit for the first signal that starts oscillation at the transition timing of the first signal and generates an oscillation clock signal for the first signal,
   a j-th oscillation circuit that starts oscillation at the transition timing of the j-th clock signal and generates a j-th oscillation clock signal having a frequency different from a frequency of the oscillation clock signal for the first signal,
   a first time-to-digital converter that outputs the first digital value based on the oscillation clock signal for the first signal and the j-th oscillation clock signal,
   an oscillation circuit for the second signal that starts oscillation at the transition timing of the second signal and generates an oscillation clock signal for the second signal,
   a k-th oscillation circuit that starts oscillation at the transition timing of the k-th clock signal and generates a k-th oscillation clock signal having a frequency different from a frequency of the oscillation clock signal for the second signal, and
   a second time-to-digital converter that outputs the second digital value based on the oscillation clock signal for the second signal and the k-th oscillation clock signal.

6. The circuit device according to claim 1, wherein the clock signal generation circuit outputs a first clock signal corresponding to a first multi-phase clock signal of the plurality of multi-phase clock signals, a second clock signal corresponding to a second multi-phase clock signal, and a third clock signal corresponding to a third multi-phase clock signal, and
   each of the i-th clock signal, the j-th clock signal, and the k-th clock signal is one of the first clock signal, the second clock signal, and the third clock signal.

7. The circuit device according to claim 6, wherein the time-to-digital conversion circuit includes
   a first counter that performs a count operation from the transition timing of the first signal to the transition timing of the second signal based on the first clock signal and outputs a first count value,
   a second counter that performs a count operation from the transition timing of the first signal to the transition timing of the second signal based on the second clock signal and outputs a second count value, and
   a third counter that performs a count operation from the transition timing of the first signal to the transition timing of the second signal based on the third clock signal and outputs a third count value, and
   the processing circuit uses
      any one of the first count value, the second count value, and the third count value as the count value.

8. The circuit device according to claim 7, wherein the processing circuit determines
   which one of the first count value, the second count value, and the third count value is used as the count value based on signal levels of the plurality of multi-phase clock signals at the transition timing of the first signal.

9. The circuit device according to claim 6, wherein the time-to-digital conversion circuit includes
   an oscillation circuit for the first signal that starts oscillation at the transition timing of the first signal and generates an oscillation clock signal for the first signal,
   a first oscillation circuit that starts oscillation at a transition timing of the first clock signal and generates a first oscillation clock signal having a frequency different from a frequency of the oscillation clock signal for the first signal,
   a second oscillation circuit that starts oscillation at a transition timing of the second clock signal and generates a second oscillation clock signal having a frequency different from the frequency of the oscillation clock signal for the first signal,
   a third oscillation circuit that starts oscillation at a transition timing of the third clock signal and generates a third oscillation clock signal having a frequency different from the frequency of the oscillation clock signal for the first signal,
a first time-to-digital converter that outputs a first digital value for the first signal based on the oscillation clock signal for the first signal and the first oscillation clock signal,
a second time-to-digital converter that outputs a second digital value for the first signal based on the oscillation clock signal for the first signal and the second oscillation clock signal, and
a third time-to-digital converter that outputs a third digital value for the first signal based on the oscillation clock signal for the first signal and the third oscillation clock signal, and
the processing circuit determines
any one of the first digital value for the first signal, the second digital value for the first signal, and the third digital value for the first signal as the first digital value.

10. The circuit device according to claim 9, wherein the processing circuit determines
which one of the first digital value for the first signal, the second digital value for the first signal, and the third digital value for the first signal is used as the first digital value based on signal levels of the plurality of multi-phase clock signals at the transition timing of the first signal.

11. The circuit device according to claim 9, wherein the time-to-digital conversion circuit includes
an oscillation circuit for the second signal that starts oscillation at the transition timing of the second signal and generates an oscillation clock signal for the second signal,
a fourth oscillation circuit that starts oscillation at the transition timing of the first clock signal and generates a fourth oscillation clock signal having a frequency different from a frequency of the oscillation clock signal for the second signal,
a fifth oscillation circuit that starts oscillation at the transition timing of the second clock signal and generates a fifth oscillation clock signal having a frequency different from the frequency of the oscillation clock signal for the second signal,
a sixth oscillation circuit that starts oscillation at the transition timing of the third clock signal and generates a sixth oscillation clock signal having a frequency different from the frequency of the oscillation clock signal for the second signal,
a fourth time-to-digital converter that outputs a first digital value for the second signal based on the oscillation clock signal for the second signal and the fourth oscillation clock signal,
a fifth time-to-digital converter that outputs a second digital value for the second signal based on the oscillation clock signal for the second signal and the fifth oscillation clock signal, and
a sixth time-to-digital converter that outputs a third digital value for the second signal based on the oscillation clock signal for the second signal and the sixth oscillation clock signal, and
the processing circuit determines
any one of the first digital value for the second signal, the second digital value for the second signal, and the third digital value for the second signal as the second digital value.

12. The circuit device according to claim 11, wherein the processing circuit determines
which one of the first digital value for the second signal, the second digital value for the second signal, and the third digital value for the second signal is used as the second digital value based on signal levels of the plurality of multi-phase clock signals at the transition timing of the second signal.

13. A physical quantity measuring device comprising:
the circuit device according to claim 1; and
a processing device performing processing based on the digital value from the circuit device.

14. An electronic apparatus comprising:
the circuit device according to claim 1; and
a processing device performing processing based on the digital value from the circuit device.

15. A vehicle comprising:
the circuit device according to claim 1; and
a processing device performing processing based on the digital value from the circuit device.

* * * * *